(12) United States Patent
Takahashi et al.

(10) Patent No.: US 8,960,970 B2
(45) Date of Patent: *Feb. 24, 2015

(54) LIGHT EMITTING DEVICE AND METHOD FOR MANUFACTURING SAME

(71) Applicant: Nichia Corporation, Anan-shi, Tokushima (JP)

(72) Inventors: Hiroki Takahashi, Novi, MI (US); Yoshitaka Bando, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/905,433

(22) Filed: May 30, 2013

(65) Prior Publication Data

US 2013/0258679 A1 Oct. 3, 2013

Related U.S. Application Data

(63) Continuation of application No. 13/323,295, filed on Dec. 12, 2011, now Pat. No. 8,475,013.

(30) Foreign Application Priority Data

Dec. 28, 2010 (JP) .................................. 2010-293295

(51) Int. Cl.
*H01L 27/15* (2006.01)
*H01L 29/06* (2006.01)
(Continued)

(52) U.S. Cl.
CPC ................ *F21V 3/00* (2013.01); *H01L 33/486* (2013.01); *H01L 25/0753* (2013.01); *H01L 33/50* (2013.01);
(Continued)

(58) Field of Classification Search
USPC .................. 257/81, 82, 98–100, 79–103, 918
See application file for complete search history.

(56) References Cited

U.S. PATENT DOCUMENTS 5,202,288 A * 4/1993 Doering et al. ................. 29/827
6,274,890 B1    8/2001 Oshio et al.
(Continued)

FOREIGN PATENT DOCUMENTS

JP    H05-050754 U    7/1993
JP    H10-261821 A    9/1998
(Continued)

OTHER PUBLICATIONS

International Search Report of the corresponding international application No. PCT/JP2011/074139, dated Jan. 24, 2012.
(Continued)

*Primary Examiner* — Dao H Nguyen
*Assistant Examiner* — Tram H Nguyen
(74) *Attorney, Agent, or Firm* — Global IP Counselors, LLP

(57) ABSTRACT

A light emitting device has a light emitting element, a metal member, a covering member and a translucent member. The metal member has a first face and a second face on an opposite side from the first face. The first face has an element placement portion and a flat portion disposed around the element placement portion with the light emitting element being mounted on the element placement portion. The covering member is disposed on the second face of the metal member at the flat portion outside an illumination range of light emitted from the light emitting element. The translucent member seals part of the metal member and the light emitting element. The translucent member has a convex portion and a flange disposed around the convex portion, the flange being disposed outside the illumination range of light emitted from the light emitting element.

15 Claims, 9 Drawing Sheets

(51) Int. Cl.
*H01L 31/12* (2006.01)
*H01L 33/00* (2010.01)
*F21V 3/00* (2006.01)
*H01L 33/48* (2010.01)
*H01L 25/075* (2006.01)
*H01L 33/50* (2010.01)
*H01L 33/54* (2010.01)
*H01L 33/62* (2010.01)
*H01L 23/00* (2006.01)

(52) U.S. Cl.
CPC ............... *H01L 33/54* (2013.01); *H01L 33/62* (2013.01); *H01L 2224/48137* (2013.01); *H01L 2224/48247* (2013.01); *H01L 2224/48465* (2013.01); *H01L 2924/1815* (2013.01); *H01L 2224/45144* (2013.01); *H01L 2924/01322* (2013.01); *H01L 2924/3025* (2013.01); *H01L 24/45* (2013.01); *H01L 2224/45015* (2013.01)
USPC ........................................................ 362/363

(56) References Cited

U.S. PATENT DOCUMENTS

| | | | |
|---|---|---|---|
| 6,603,148 B1 | 8/2003 | Sano et al. | |
| 7,499,288 B2 | 3/2009 | Tanaka et al. | |
| 7,659,531 B2 * | 2/2010 | Choi et al. | 250/551 |
| 7,910,946 B2 * | 3/2011 | Kamada | 257/99 |
| 8,044,418 B2 * | 10/2011 | Loh et al. | 257/98 |
| 8,044,424 B2 * | 10/2011 | Urano et al. | 257/98 |
| 8,129,734 B2 * | 3/2012 | Mazzochette | 257/98 |
| 2006/0039143 A1 * | 2/2006 | Katoh et al. | 362/244 |
| 2006/0102917 A1 | 5/2006 | Oyama et al. | |
| 2007/0241362 A1 * | 10/2007 | Han et al. | 257/100 |
| 2007/0291489 A1 * | 12/2007 | Baroky et al. | 362/294 |
| 2008/0054354 A1 * | 3/2008 | Oh et al. | 257/334 |
| 2008/0298063 A1 | 12/2008 | Hayashi | |
| 2009/0146176 A1 | 6/2009 | Oishi | |
| 2009/0242915 A1 * | 10/2009 | Chang Chien et al. | 257/98 |
| 2009/0289268 A1 * | 11/2009 | Kamada | 257/98 |
| 2010/0027291 A1 * | 2/2010 | Hamada | 362/613 |
| 2010/0155771 A1 | 6/2010 | Bando | |
| 2011/0006317 A1 * | 1/2011 | McMillan | 257/89 |
| 2011/0222299 A1 * | 9/2011 | Takahashi et al. | 362/363 |
| 2012/0012879 A1 | 1/2012 | Loh et al. | |

FOREIGN PATENT DOCUMENTS

| | | |
|---|---|---|
| JP | H11-346008 A | 12/1999 |
| JP | 2002-324917 A | 11/2002 |
| JP | 2007-67284 A | 3/2007 |
| JP | 2008-300694 A | 12/2008 |
| JP | 2009-026846 A | 2/2009 |
| JP | 2009-146935 A | 7/2009 |
| WO | 2004-001862 A1 | 12/2003 |

OTHER PUBLICATIONS

Australian Patent Examination Report No. 1 of the corresponding Australian application No. 2011353319, dated Apr. 22, 2013.

* cited by examiner

LIGHT EMITTING DEVICE AND METHOD FOR MANUFACTURING SAME

CROSS-REFERENCE TO RELATED APPLICATIONS

This application is a continuation of U.S. application Ser. No. 13/323,295, filed Dec. 12, 2011, which claims priority to Japanese Patent Application No. 2010-293295 filed on 28 Dec. 2010. The entire disclosures of U.S. application Ser. No. 13/323,295 and Japanese Patent Application No. 2010-293295 are hereby incorporated herein by reference in their entirety.

BACKGROUND

1. Technical Field

The present invention relates to a light emitting device and a method for manufacturing the same.

The light emitting element shown in FIG. 11, for example, has been proposed as an example of a light emitting device in which a light emitting element mounted on a metal member, and part of the metal member and the light emitting element are embedded in a sealing member (Japanese Laid-Open Patent Application H11-346008, for example).

With this light emitting device 40, a pair of lead terminals is constituted by a metal member 42 on which a light emitting element 41 is placed, and a paired metal member 43. The light emitting element 41 and the metal members 42 and 43 are embedded in a translucent member 44, and the sealing member 44 constitutes a lens-shaped convex portion 44a above the light emitting element 41. The lead terminals are bent at the outer side of the sealing member.

With a light emitting device such as this, when harsh temperature changes in the usage environment of the light emitting device are taken into account, the adhesion between the metal members and the sealing member comes into doubt. Also, the area around the metal members is enveloped by a relatively thick film of the sealing member to ensure the strength of the sealing member, but there is unintended leakage of light from the bottom face and side faces of the light emitting device, and the light extraction efficiency to the upper face side of the light emitting device tends to decrease.

Meanwhile, As shown in FIG. 12, to achieve a more uniform emission pattern, a light emitting device has been proposed in which the side of a metal member 50 on which a light emitting element 51 is mounted is covered with a translucent resin 53, and the metal member 50 is covered with a black resin 52 except for the portion around the light emitting element 51, which prevents reflection by the metal member 50 other than around the light emitting element 51, and prevents light from scattering (Japanese Laid-Open Utility Model Application H5-50754).

SUMMARY

With modern light emitting devices, however, there is a need for better light extraction efficiency, an even smaller size, and a thinner profile, and it is necessary to strike a good balance in the relation between ensuring good strength of the sealing member and adhesion between the metal member and the sealing member, reducing size and thickness, etc., while also improving all performance aspects, such as better light extraction efficiency.

The present invention was conceived in light of the above problem, and it is an object thereof to provide a light emitting device with which light extraction efficiency can be increased and better performance ensured.

The inventors conducted diligent research into the design of a light emitting device, including the shape, layout, etc., of a metal member and a sealing member that will result in high light extraction efficiency and a smaller and thinner light emitting device, and into the manufacturing efficiency at which this can be realized. As a result, an light emitting device constitution was discovered with which, even if a reduction in the size of the light emitting device decreases the contact surface area between the metal member and the sealing member, the metal member will still be adequately sealed by the sealing member and manufacturing efficiency improved, and various characteristics, such as heat dispersion, the strength of the light emitting device, service life, and so forth, can also be improved. This led to the completion of the present invention.

The present invention includes the following inventions.

A light emitting device, comprising:
a light emitting element;
a metal member having a first face and a second face on an opposite side from the first face, the first face having an element placement portion and a flat portion disposed around the element placement portion with the light emitting element being mounted on the element placement portion;
a covering member disposed on the second face of the metal member at the flat portion outside an illumination range of light emitted from the light emitting element; and
a translucent member sealing part of the metal member and the light emitting element, the translucent member having a convex portion and a flange disposed around the convex portion, the flange being disposed outside the illumination range of light emitted from the light emitting element.

(2) The light emitting device according to (1) above, wherein the translucent member is softer than the covering member.

(3) The light emitting device according to (1) or (2) above, wherein the covering member exposes the first face of the flat portion.

(4) The light emitting device according to any of (1) to (3) above, wherein the covering member covers the second face of the flat portion and an outer periphery of the flat portion, the upper face of the covering member substantially coincides with the first face of the flat portion, and the upper face of the covering member and the upper face of the flat portion are covered by the translucent member.

(5) The light emitting device according to any of (1) to (4) above, wherein the translucent member has a convex portion and a flange disposed around the convex portion, and the flange is disposed outside the illumination range of light emitted from the light emitting element.

(6) The light emitting device according to (5) above, wherein part of the flat portion of the metal member is disposed within the flange.

(7) The light emitting device according to any of (1) to (6) above, wherein the metal member has a first curved portion that curves continuously from the flat portion to the bottom face side of the light emitting device, and a second curved portion that curves further to the side face side of the light emitting device, and is covered by the covering member from the first curved portion to the second curved portion.

(8) The light emitting device according to any of (5) to (7) above, wherein the thickness of the flange at the upper face of the covering member and the flat portion is less than the thickness of the translucent member at the side face of the covering member.

(9) The light emitting device according to any of (1) to (8) above, wherein the thickness of the translucent member at the upper face of the covering member and the flat portion is 50 to 100 μm.

(10) The light emitting device according to any of (1) to (3) and (5) to (9) above, wherein the covering member further covers the outer periphery of the flat portion.

(11) The light emitting device according to any of (1) to (10) above, wherein the covering member exposes the bottom face of the element placement portion of the metal member, and is disposed at the outer periphery of the element placement portion.

(12) The light emitting device according to any of (1) to (11) above, wherein the element placement portion of the metal member is formed as a concave portion by being bent to the bottom face side of the light emitting device with respect to the flat portion.

(13) The light emitting device according to (12) above, wherein the covering member is packed so as to surround the concave portion, and the height of the lower face of the covering member substantially coincides with the height of the lower face of the concave portion.

(14) A method for manufacturing a light emitting device, comprising the steps of:

(a) disposing, in molds, a metal member having an element placement portion on a first face of which is placed a light emitting element, and a flat portion disposed around the element placement portion, and forming a covering member that covers at least a second face, that is on the opposite side from the first face, of the flat portion of the metal member;

(b) placing a light emitting element on the element placement portion of the metal member; and (c) disposing the metal member covered by the covering member in a second molds, holding the upper face and lower face of the covering member with the second molds, and forming a translucent member that covers part of the metal member and the upper face and side faces of the covering member.

(15) The method for manufacturing a light emitting device according to (14) above, wherein, in step (a), a first face of the flat portion is exposed to form the covering member, and in step (c), the first face of the flat portion and the upper face of the covering member, and the lower face of the covering member are held by the second molds.

(16) The method for manufacturing a light emitting device according to (14) or (15) above, wherein, in step (a), the bottom face of the element placement portion is exposed to form the covering member, and in step (c), the translucent member that exposes the bottom face of the element placement portion is formed.

(17) The method for manufacturing a light emitting device according to (14) to (16) above, wherein the viscosity of the covering member material when the covering member is formed is higher than the viscosity of the translucent member material when the translucent member is formed.

With the light emitting device of the present invention, a light emitting device can be obtained with which light extraction efficiency is improved and better performance can be ensured.

With the method for manufacturing a light emitting device of the present invention, a light emitting device with good emission efficiency and improved characteristics can be manufactured efficiently.

DETAILED DESCRIPTION OF EXEMPLARY EMBODIMENTS

Figure 1A:
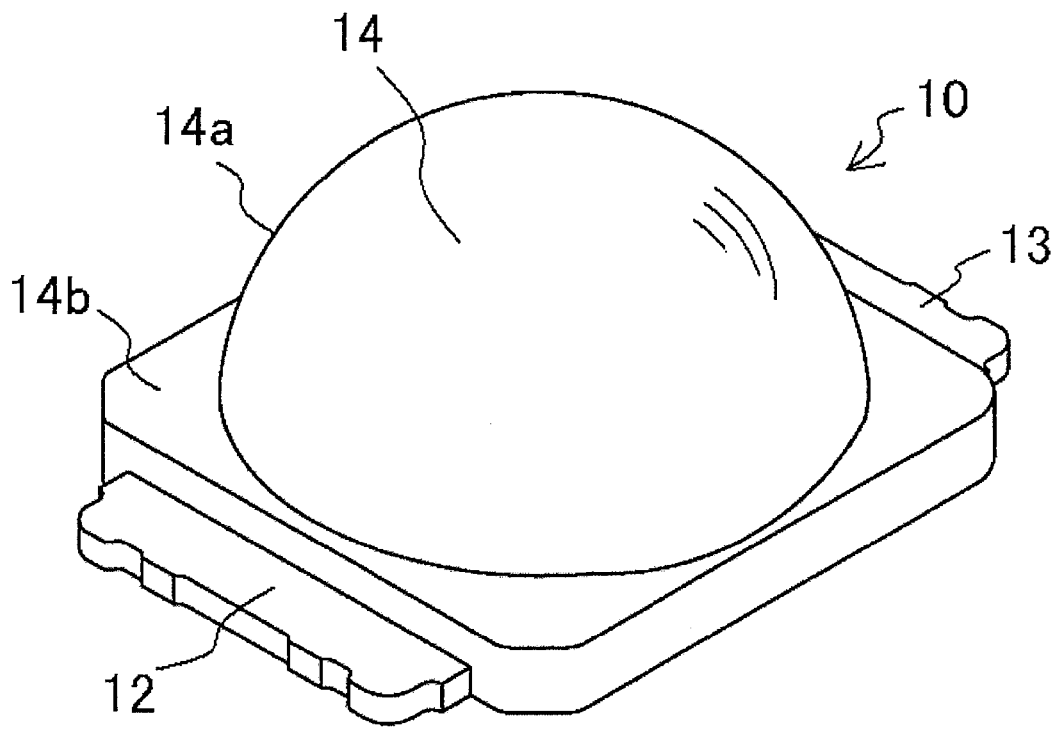
FIG. 1A is an oblique view of an embodiment of the light emitting device of the present invention, and particularly the outer shape of a translucent member 14.

The light emitting device of the present invention is made up mainly of a light emitting element, a metal member, a translucent member, and a covering member. The translucent member and the covering member constitute what is known as a package, and the two of them may be collectively referred to simply as a "sealing member." The term "sealing" here means sealing by either direct contact or non-contact.

In this application, the terms "upper face" and "first face (one face)" refer to a face on the light extraction side of the light emitting device, and "first face" in particular refers to a face of the metal member, while "bottom face" and "second face (another face)" refer to faces on the opposite side from the upper face and the one face (first face), and "second face" in particular refers to a face of the metal member. The phrase "bottom face of the light emitting device" refers to the bottom face of the sealing member constituting the light emitting device.

Translucence means a property whereby at least about 70%, and preferably at least about 80%, at least about 90%, and at least about 95%, of the light emitted from the light emitting element is transmitted.

(Light Emitting Element)

The light emitting element is a semiconductor light emitting element, and may be any element that is known as a light emitting diode. For example, a laminated structure including a light emitting layer may be formed by various semiconductors, such as InN, AlN, GaN, InGaN, AlGaN, InGaAlN, or another such nitride semiconductor, a group III-V compound semiconductor, a group II-VI compound semiconductor, or the like, on a substrate.

Examples of substrates include insulating substrates such as sapphire or spinel ($MgAl_2O_4$) whose main plane is the C plane, A plane, or R plane, silicon carbide (6H, 4H, 3C), silicon, ZnS, ZnO, GaAs, diamond, an oxide substrate such as lithium niobate or neodymium gallate, and nitride semiconductors such as GaN and AlN.

Examples of the semiconductor structure include an MIS junction, a PIN junction, a PN junction, or another such homostructure, a hetero bond, and a double hetero bond.

The semiconductor layers that make up the light emitting element may be doped with silicon, germanium, or another such donor impurity and/or zinc, magnesium, or another such acceptor impurity.

The light emitting layer may be a single quantum well structure or a multiple quantum well structure formed in a thin-film that produces a quantum effect.

The emission wavelength of the light emitting element can be varied from the ultraviolet band to red, by varying the material of the semiconductor, the mixed crystal ratio, the indium content of the InGaN in the light emitting layer, or the type of impurity with which the light emitting layer is doped.

(Metal Member)

The metal member is usually electrically connected to the light emitting element and, optionally, a protective element or the like (hereinafter may be referred to as "light emitting element or the like"), and generally functions as a lead electrode and for mounting the light emitting element or the like. The metal member is partially embedded in the sealing member (discussed below) along with the light emitting element or the like. Accordingly, the metal member comprises a portion (such as an internal terminal) that functions as a mounting seat for the light emitting element or the like in the sealing member, and a portion (such as an external terminal) that extends to outside the sealing member and functions for electrical connection with the outside.

Therefore, there are no particular restrictions on the material of the metal member as long as these functions can be fulfilled, but forming it from a material with a relatively high thermal conductivity is preferable. Forming it from such a material allows the heat generated by the light emitting element to be efficiently eliminated. For example, it can be a material having a thermal conductivity of at least about 200 W/(m·K), or one having relatively high mechanical strength, or one that is easy to punch, etch, or otherwise work. Examples include copper, aluminum, gold, silver, tungsten, iron, nickel, or another such metal, an iron-nickel alloy, phosphor bronze, or another such alloy, and these metals or alloys whose surface has been plated with silver, aluminum, copper, gold, or another such metal. It is particularly favorable for the metal member to be formed from a conductive material that affords good electrical connection (such as gold or gold plating). It is also favorable for the surface of the metal member to be smooth in order to increase reflectivity. In particular, it is preferable for the element placement portion (or the element placement portion and its surrounding portion) to be formed from a material with high reflectivity (such as gold or gold plating). The metal member is usually formed in a uniform film thickness, but may partially be thicker or thinner.

Because of the above, it is preferable for the entire metal member to be formed from gold or a material whose surface is gold plated, and for the element placement portion to be formed from silver or a material whose surface is silver plated. If a concave portion is formed as the element placement portion, the silver or silver plating may extend not only into the concave portion, but also to the flat portion, and preferably extends to the flat portion located around the outside of the concave portion. When the outer periphery of the concave portion is formed from a silver-plated material, if that width of part is too narrow, and misalignment occurs in the spot of silver plating, part of the inside of the concave portion may not be covered by the silver-plated material, but if width of this outer peripheral part is too wide, it will be far to the wire bonding region, and this may lead to wire fatigue, wire breakage, enlargement of the light emitting device, etc. Thus, the width of the outer periphery is favorably about 0.3 mm or less, with about 0.2 mm or less being even better. As a result, the silver will enhance adhesion between the portions when the first face of the metal member is covered with the sealing member, and this will improve long-term reliability.

The metal member has a first face on which the light emitting element is placed, and a second face that is on the opposite side from the first face. It also has an element placement portion on which the light emitting element is placed, and a flat portion disposed around this element placement portion.

There are no particular restrictions on the shape of the metal member, which can be suitably decided by taking into account the shape of the light emitting device, the number of light emitting elements, their layout, the installation space, and so forth.

Figure 3:
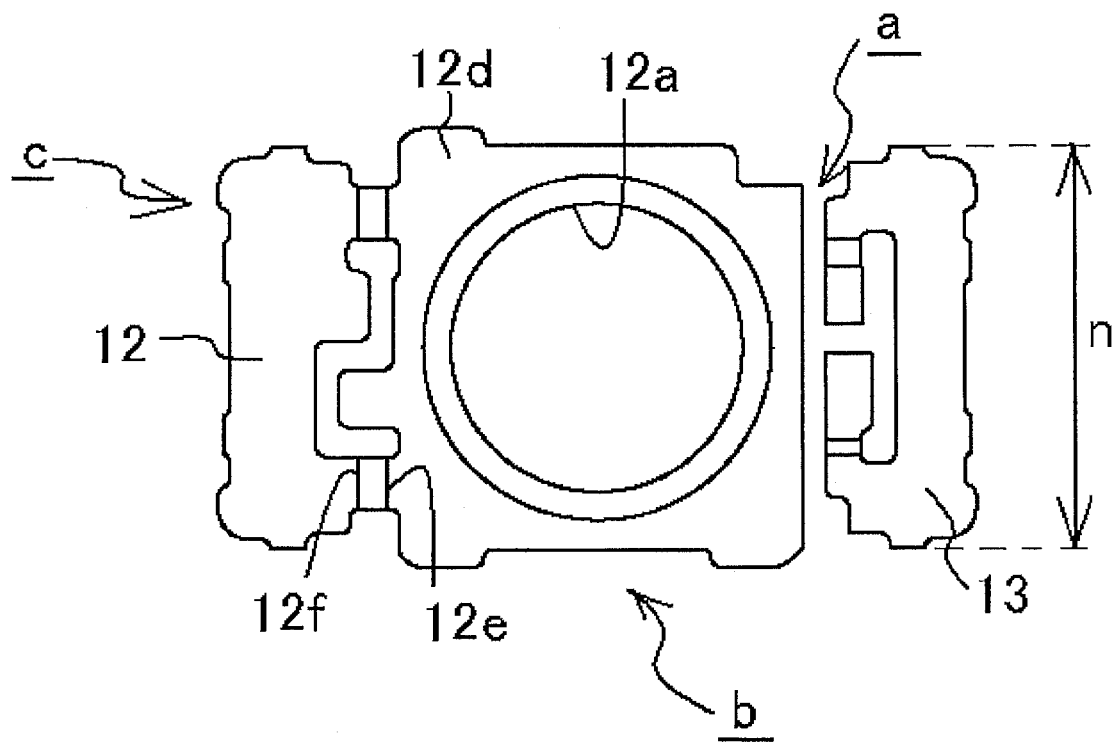
FIG. 3 is a plan view of a metal member 12 in the light emitting device in FIG. 1A.

The element placement portion is a portion that functions for placing the light emitting element, and is preferably flat in order for the light of the light emitting element to be emitted efficiently onto the upper face thereof. As shown in FIG. 3, the flat portion of the metal member 12 has a concave portion formed in a concave shape by being bent to the bottom face side of the light emitting device, and a first face (the upper face) of the bottom part of this concave portion may serve as an element placement portion 12a. Forming a concave portion ensures that the light emitting element is disposed in the proper location, and ensures the sealing stability of the sealing member. Also, if the light is reflected at the side faces of the concave portion, the light emitted laterally from the light emitting element can be directed toward the upper face side of the light emitting device, which improves the light extraction efficiency to the upper face of the light emitting device.

The element placement portion and the concave portion should have a bottom face area at least large enough for the light emitting element to be placed, and can have a circular shape, an elliptical shape, a polyhedral shape optionally with the corners rounded, or a modified version of one of these shapes.

The size and depth of the concave portion are preferably such that when the light emitting element is disposed at the proper location inside the concave portion, neither light emitted from the light emitting element, nor reflected light or other such emitted light will be blocked. In particular, it is preferable if neither the light emitted from the light emitting element, nor reflected light is blocked by the upper edges, side faces, etc., of the concave portion. For example, the size of the bottom face of the concave portion is favorably larger than the surface area occupied by the light emitting element, and preferably at least about 1.2 times the occupied surface area. The depth may be at least the height of the light emitting element, and is preferably at least about 0.1 mm, and more preferably at least about 0.5 mm.

The side faces of the concave portion may be vertical, but they are preferably inclined so as to narrow toward the bottom face. For example, they are preferably inclined at about 0 to 45°, and more preferably about 20 to 40°, in the parabolic direction with respect to the bottom face. This allows light from the light emitting element to be guided efficiently to the upper face. Furthermore, it is preferable if the surface of the concave portion is rounded from its side faces all the way to the flat portion (discussed below) at the outer periphery of the concave portion. This rounding helps prevent cracking in the sealing member (discussed below) at the edge of the opening to the concave portion, and prevents the peeling of the sealing member.

As shown in FIG. 3, a flat portion 12d is disposed so as to surround the outside of the element placement portion 12a (such as a concave portion), and usually refers to the portion covered by the sealing member. Also, a covering member is disposed on the second face side of the flat portion.

The flat portion may be present in the same plane as the element placement portion, but as discussed above, when the element placement portion has a concave shape, the flat portion is disposed at a different height from that of the bottom face of the concave portion.

There are no particular restrictions on the planar shape of the flat portion surrounding the concave portion, but as discussed above, for example, a part that is continuous from the concave portion preferably substantially conforms to the shape of the adjacent concave portion (that is, either a shape that is the same or substantially the same as that of the concave portion, or a corresponding shape) (see a in FIG. 3). For instance, it can have a circular shape, an elliptical shape, a polyhedral shape optionally with the corners rounded, or a modified version of one of these shapes. This allows the sealing member that seals the light emitting element to be formed stably in a shape that conforms to the outer periphery of the concave portion. As shown in FIG. 3, the flat portion formed so as to substantially conform to the shape of the adjacent concave portion is preferably opposite a second metal member 13 (discussed below).

The profile of the flat portion at the other part besides the part discussed above (see b in FIG. 3) can be similar to the planar shape of the sealing member (that is, either a shape that is the same or substantially the same, or a corresponding shape), and usually can be a rounded polyhedral shape or a modified version of one of these shapes. This increases the strength of the sealing member, and the flange (discussed below) in particular.

The other part of the flat portion (see c in FIG. 3, for example) is a region that functions as a so-called internal terminal and/or external terminal. Therefore, the above-mentioned concave portion is favorably a shape that extends to the opposite side from the concave portion. The width of the region that functions as the extending terminal (the width n in FIG. 3) can be suitably set according to the desired performance of the light emitting device and so on. For instance, it is preferably the same or slightly larger than the diameter of the concave portion.

The flat portion can also be the region in which the above-mentioned protective element, etc., is placed. Also, the flat portion can be easily sandwiched (held, clamped, etc.) between upper and lower molds with a simple shape in sealing the metal member with the translucent member and/or covering member (discussed below).

A second metal member that serves as a pair of positive and negative electrodes with respect to the element placement portion is located opposite the metal member having the element placement portion.

The second metal member has a flat portion, and this flat portion preferably corresponds to the flat portion of the above-mentioned metal member. The light emitting element and the flat portion of the second metal member are connected by wire. This shortens the length of the wire between the light emitting element and the second metal member when the light emitting element is placed on the element placement portion, which prevents wire breakage and the like.

The second metal member is preferably located opposite the element placement portion of the above-mentioned metal member as an internal terminal, and as an external terminal has a shape extending in a specific direction.

The metal member and the second metal member do not need to protrude to the outside from the same face of the sealing member (discussed below) (that is, in the same direction), and can protrude to the outside from a plurality of different faces (directions). For example, the distal ends of the metal member and the second metal member (that is, external terminals) may be bent in the bottom face direction of the light emitting device, or may be bent in opposite side face directions. Within the sealing member, the metal member and the second metal member preferably have a bent portion (see 12e in FIG. 3) that is bent toward the bottom face direction of the light emitting device. The metal member preferably has a bent portion (such as a first bent portion), which is bent toward the bottom face, disposed within the sealing member (such as within the main body part of the translucent member (discussed below)), and in particular depending on the width thereof, within the flange or the main body part (discussed below). Bending the metal member increases the contact surface area between the sealing member and the metal member that is present within the sealing member, and as a result prevents the peeling of the sealing member. Also, the bent portion of the metal member acts as a retainer, and effectively prevents separation between the sealing member and the metal member.

Furthermore, the metal member preferably has, within the sealing member, a bent portion that is bent toward the bottom face direction of the light emitting device (preferably within the flange (discussed below)) (first bent portion), and then is bent in the side face direction of the light emitting device (second bent portion) (see 12f in FIG. 3), and protrudes to the outside of the sealing member. This better ensures the above-mentioned prevention of peeling and separation. The first and second bent portions are preferably covered by the sealing member, and particularly the covering member (discussed below).

If the metal member protrudes from the side face of the sealing member, the second face (lower face) of the metal member at the protruding portion (that is, part of the flat portion) preferably coincides with the bottom face of the sealing member (the face disposed at the very bottom), that is, coincides with the bottom face of the light emitting device. In other words, the bottom face of the light emitting device is preferably in the same plane from the metal member all the way to the sealing member. This reinforces the sealing member with the metal member, and improves the strength of the light emitting device itself.

If the metal member has a concave portion as an element placement portion, the flat portion of the metal member may be bent with a height differential that is greater than the depth of the concave portion, but is preferably bent with a height differential that coincides with the depth of the concave portion. That is, part of the second face of the flat portion of the metal member preferably substantially coincides (is substantially in the same plane) with the bottom face of the concave portion.

Figure 9:
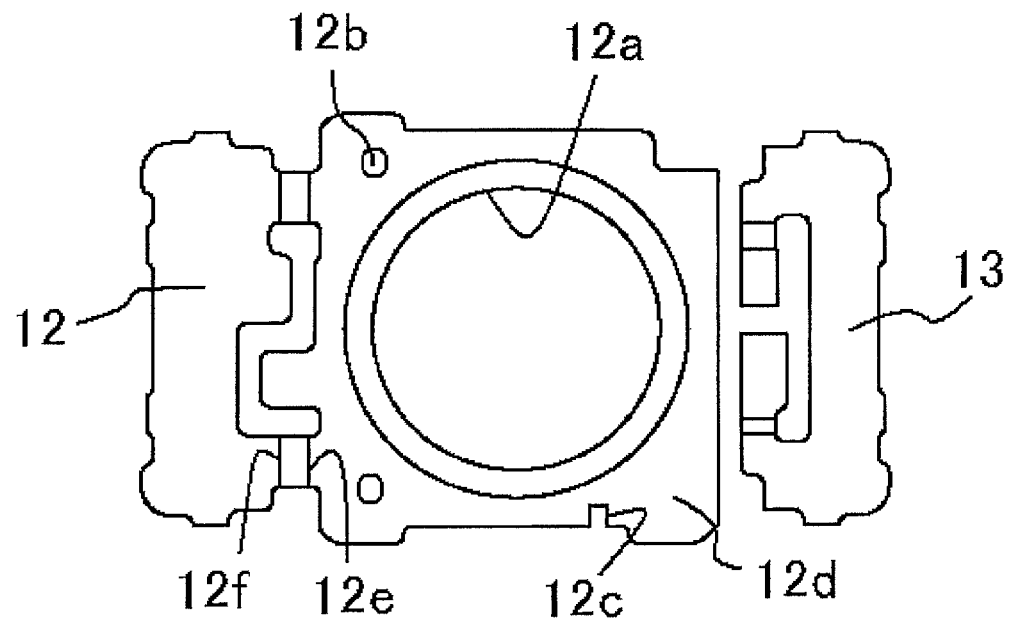
FIG. 9 is a plan view of other metal members 12 and 13 in a light emitting device.

As shown in FIG. 9, for example, the metal member preferably has a recess, a through-hole 12b, or a cut-out 12c (hereinafter sometimes referred to as "recess, etc."), which anchors or determines the formation of the sealing member, formed on its surface near the bent portion and/or the flat portion. The recess, etc., may have the sealing member disposed in its interior to increase the contact surface area between the two, or may be able to fix part of the sealing member, for example. This further enhances the adhesion between the metal member and the sealing member.

There are no particular restrictions on the planar shape, layout, size, depth, and so forth of the recess, etc., and these can be suitably adjusted by the size of the light emitting device, the material being used for the sealing member, and so on. The recess, etc., are preferably disposed outside the range of illumination by the light from the light emitting element, which can prevent the light from passing through.

The metal member is usually wire bonded to provide electrical connection with the light emitting element and, if desired, a protective element. The wire preferably has good ohmic properties with the electrodes of the light emitting element, or good mechanical connectivity, or good electrical and thermal conductivity. The thermal conductivity is preferably at least about 0.01 cal/S·cm$^{2.°}$ C./cm, and more preferably at least about 0.5 cal/S·cm$^{2.°}$ C./cm. When ease of work and so forth are taken into account, the diameter of the wire is preferably about 10 to 45 μm. Examples of this wire material include gold, copper, platinum, aluminum, and other such metals and alloys thereof. The wire can be easily connected to the light emitting element and the wire bonding-use metal member by using a wire bonding device.

The metal member may comprise the above-mentioned first and second (that is, at least two) metal members in a single light emitting device. If the second face of the metal member is substantially in the same plane with the bottom face of the sealing member, there will be fewer metal members, which will reduce shifting in the disposition of the various members in the same plane and boost manufacturing efficiency.

The number of metal members may be equal to one plus the number of light emitting elements mounted on the metal members, or may be at least two times the number of light emitting elements mounted on the metal members. For instance, if just one light emitting element is mounted, the light emitting element is placed on one metal member, an electrical connection is made with one electrode of the light emitting element, and the other metal member may be electrically connected with the other electrode of the light emitting element.

If two or more light emitting elements are mounted, all or a few of the light emitting elements are placed on a single metal member, an electrical connection is made, and then the other metal member may be electrically connected separately according to the various light emitting elements.

Also, the constitution may be such that the various light emitting elements are placed on a separate metal member and electrically connected, and then yet another metal member is separately electrically connected according to the various light emitting elements.

Thus, if a plurality of light emitting elements are mounted, and independent wiring is made that electrically connects to a metal member independently, it will be possible to select from among a variety of wiring patterns, such as series and parallel, and this affords greater latitude in circuit design. Also, in the case of independent wiring, it is easier to adjust the emission strength of the light emitting elements that are put in place, so this is particularly advantageous when using a plurality of light emitting elements having different emission colors, such as with a full-color LED. In addition, the heat dissipation paths of the light emitting elements can be formed without overlapping. Thus, heat generated from the light emitting elements can be dissipated uniformly, and heat dissipation is better.

(Covering Member)

The covering member functions as a package for the light emitting device along with the translucent member, which is discussed below.

The covering member is formed from a material that is harder than the translucent member. "Harder than the translucent member" here generally means that the hardness is greater. "Hardness" in this case means that when the translucent member (discussed below) and the covering member are tested by the same hardness test method, the hardness values thereof are greater than that of the translucent member. All of these test methods shall be assumed to have been carried out at 25° C.

The hardness value of the covering member will vary with the test method, but is favorably at least about 5%, preferably at least about 10%, and more preferably at least about 15%, greater (harder) than the hardness value of the translucent member.

The covering member preferably has a hardness greater (harder) than that of the translucent material such that a test for the covering member corresponds to its hardness, and is different from that suitable for the translucent material.

Also, the covering member can be formed from a material that does not have rubber-like elasticity. Alternatively, it can be formed from a material having a hardness expressed as indentation hardness. This indentation hardness is generally expressed as a hardness obtained in a Rockwell hardness test and/or a Vickers hardness test.

The Rockwell and Vickers hardness tests here are both known test methods.

For example, a Rockwell hardness test is a method in which a probe is used, first an initial test force is applied, then a test force is applied, and when the force returns to the initial test force, the depth to which the probe has penetrated is measured at the initial test force two times before and after. This hardness can be calculated from the difference from the penetration depth (indentation depth).

The Vickers hardness test is a method in which a test force is applied to a probe, the probe is pushed into the sample, and the contact surface area between the probe and the sample is measured. This hardness can be calculated by dividing the test force applied to the probe by the contact surface area.

The covering member may have a hardness obtained by a JIS-A hardness test or expressed as Shore A hardness.

When the hardness is measured by a Shore hardness test, it is preferably at least about 70, and more preferably at least about 90, for example.

Shore A hardness and JIS-A hardness tests are both known test methods. For example, they are methods in which a probe is pushed in to deform the surface of a measurement sample, and the amount of deformation (indentation depth) is measured and digitized.

If the Shore A hardness or JIS-A hardness exceeds 90, the Shore D hardness is usually used.

Therefore, the covering member is preferably made form a material whose hardness is expressed by Shore D hardness.

The Shore D hardness test is a known test method. This method differs from the JIS-A hardness test in the size and shape of the probe and the indentation load. The Shore D hardness test is better suited to the measurement of a sample whose elasticity is lower than the JIS-A hardness test.

Saying that the covering member is hard is the same as saying that the viscosity during molding (when molten) is higher than that of the translucent member, for example. The viscosity during molding will vary with the material, but when the material that constitutes the covering member is melted at a temperature suited to that material in an ordinary semiconductor process, the viscosity is favorably at least about 10 Pa·s. When actual manufacturing is taken into account, about 100 Pa·s or less is preferable. The temperature during molding is from 150 to 180° C., for example.

The difference in the linear coefficient of thermal expansion between the covering member and the metal member is preferably less than the difference in the linear coefficient of thermal expansion between the translucent member and the metal member. This suppresses cracking and separation during temperature changes. The linear coefficient of thermal expansion of the covering member is favorably about 100 ppm/K or less, and preferably about 50 ppm/K or less. About 20 ppm/K or higher is better yet.

The linear coefficient of thermal expansion of the metal member is lower than that of materials usually used as a sealing member, and is about 5 to 20 ppm/K, for example. The difference in the linear coefficient of thermal expansion between the covering member and the metal member is preferably about 10 to 100 ppm/K.

The difference in the linear coefficient of thermal expansion when the metal member is covered directly by the translucent member can be lessened by bringing the covering member directly into contact with the metal member, and this reduces the decrease in adhesion caused by heat between the sealing member and the metal member.

The covering member can be formed from polyphthalamide (PPA), epoxy resin, or the like.

The covering member may be a mixture obtained by mixing the above-mentioned material with any of various dyes, pigments, or the like as colorants or diffusion agents. The covering member is preferably disposed outside the illumination range of light emitted from the light emitting element. Consequently, there is no decrease in the light output of the light emitting device even when using a material with low optical reflectivity, such as a material in which carbon black or another such substance that blocks a large amount of light is admixed as a colorant, so a material that is inexpensive and has low optical reflectivity can be selected for the covering member.

Figure 1B:
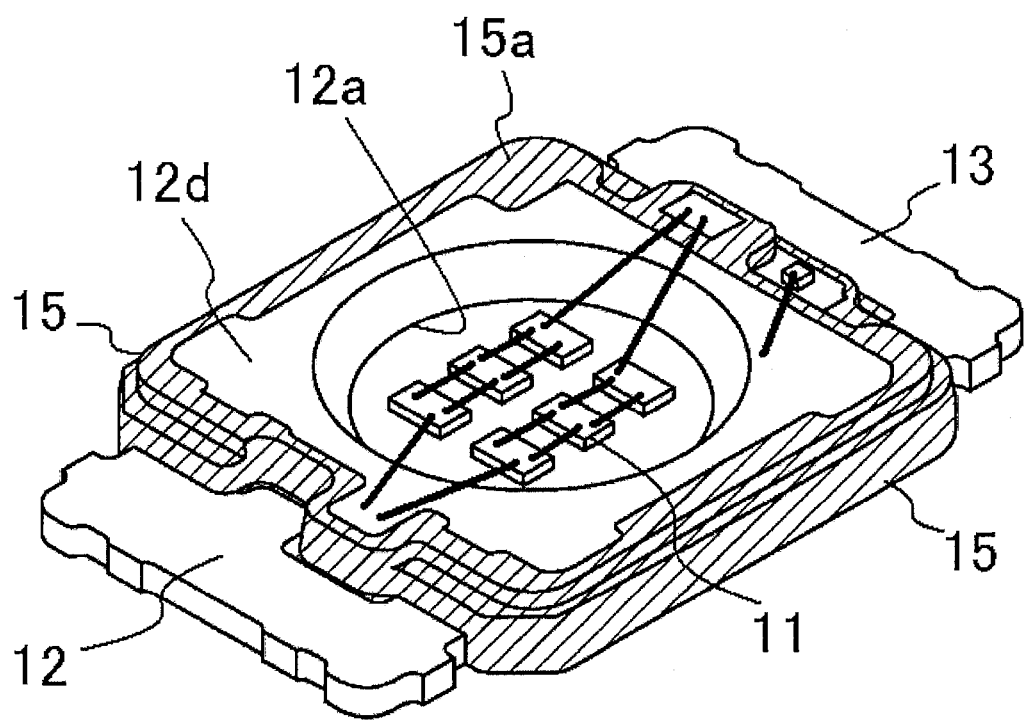
FIG. 1B is an oblique view of when the translucent member has been removed from the light emitting device in FIG. 1A.
Figure 1C:
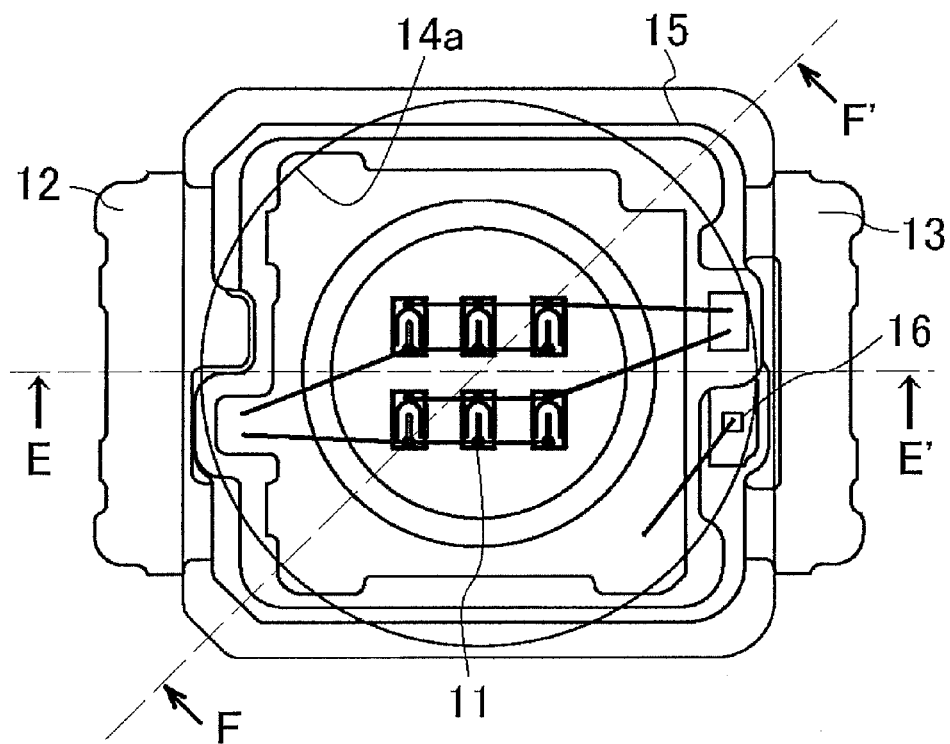
FIG. 1C is a plan view of the light emitting device in FIG. 1B (with the translucent member 14)
Figure 1D:
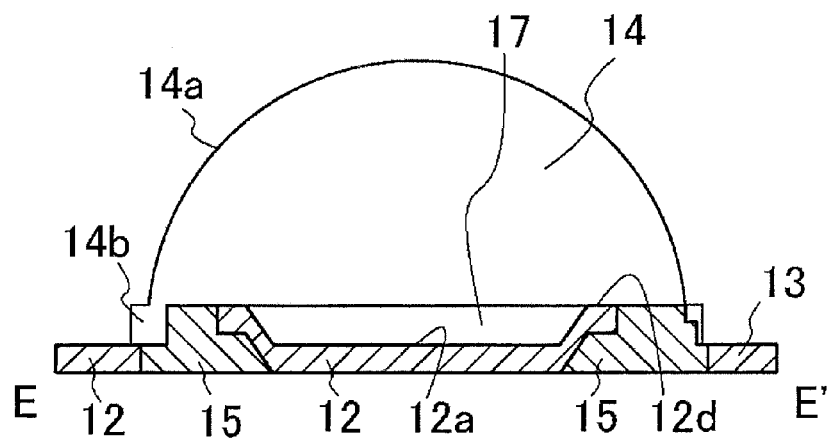
FIG. 1D is a cross section along the E-E' line of the light emitting device in FIG. 1C.

This covering member is disposed on at least the second face side of the metal member (see 15 in FIG. 1D, for example). That is, it is preferable for at least part of the second face side of the flat portion of the metal member to be covered. It is also preferable for part of the outer periphery of the flat portion to be covered, and even better for the entire outer periphery to be covered (see 15 in FIGS. 1B and 1D, for example). The covering member exposes the first face of the flat portion.

When the covering member covers the outer periphery of the flat portion, this corresponds to covering the end face of the flat portion. When the end face of the flat portion is covered, the covering member extends to the first face side of the metal member, but it is preferable if part of the upper face of the covering member disposed around the outer periphery of the flat portion substantially coincides with the first face of the flat portion of the metal member, and lies in the same plane (see FIGS. 1B and 1D). It is particularly favorable for the first face of the flat portion to substantially coincide at the corners of the flat portion, and it is preferable if the first face of the flat portion lies in the same plane all the way around the outer periphery of the flat portion.

Consequently, when the translucent member (discussed below) is molded by upper and lower molds, the portion in the same plane (particularly the corners; see M in FIG. 5B) can be stably clamped between the upper and lower molds, and the material of the sealing member can be prevented from leaking out, for example. It is preferable if the covering member is disposed so that its upper and lower faces touch the upper and lower molds in order to achieve this stable clamping between the upper and lower molds. Preferably, part of the upper face of the covering member substantially coincides with the flange (discussed below), and the lower face of the covering member is disposed so as to constitute the lower face (bottom face) of the light emitting device (see FIGS. 1C and 1D).

The covering member preferably exposes at least the bottom face of the element placement portion of the metal member, and is disposed on the outer periphery of the element placement portion. If the element placement portion is formed by a concave portion, it is even better if the covering member exposes the bottom face of the concave portion and is disposed on the outer periphery of the concave portion. This ensures a heat dissipation path for the light emitting element. In other words, it is preferable if the covering member is packed so as to surround the concave portion of the metal member, and the height of the lower face (bottom face) of the covering member substantially coincides with the height of the lower face of the concave portion (that is, the lower face of the covering member lies in substantially the same plane as the lower face of the concave portion).

(Translucent Member)

Figure 2:
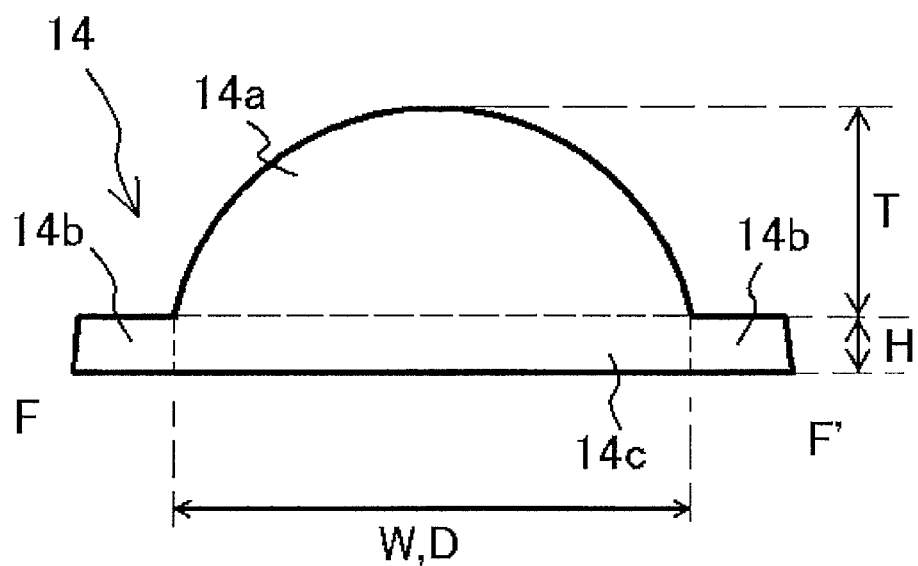
FIG. 2 is a cross section along the F-F' line illustrating the shape of the translucent member in the light emitting device in FIG. 1C.

The translucent member seals the light emitting element and, if desired, part of the metal member and the protective element, and has at least a main body portion 14c and a convex portion 14a as shown in FIG. 2, for example. The translucent member at least covers part of the upper face of the flat portion of the metal member and the upper face of the covering member, and more preferably covers the side faces of the covering member. Therefore, part of the flat portion of the metal member is preferably disposed within the translucent member, and particularly within the flange (discussed below).

The basic shape of the light emitting device (the shape of the sealing member) is usually that of a circular cylinder, an elliptical cylinder, a sphere, an egg, a triangular column, a quadrilateral column, a polygonal column, or a shape similar to these, for example, but the device is generally in the form of a quadrilateral column. Therefore, the translucent member in the present invention has a main body portion that constitutes the basic shape, and a concave portion that functions as a converging lens, for example, integrally disposed on one face of the main body portion.

The shape of the convex portion can be suitably adjusted according to the light distribution of the light emitting device, but examples include a partial sphere or egg shape, a dome shape or polygonal arm shape whose bottom face is quadrilateral, etc., and various other such shapes. Of these, a partial sphere or egg shape, and particularly a hemispherical shape, is preferable, and a shape in which the center is located near the center of the light emitting element or the light emitting element placement portion is better yet. Also, the light extraction efficiency can be improved and made greater than at least that of the light emitting element placement portion by increasing the size of the convex portion. It is better yet to provide the concave portion and make the convex portion larger than this concave portion (see FIG. 1C).

For instance, as shown in FIG. 2 (corresponds to the F-F' line cross section of FIG. 1C), the translucent member 14 mainly has a block-like main body portion 14c that integrally seals part of the metal member (not shown) and the light emitting element (not shown), etc. Preferably, it further has a part called the concave portion 14a that is disposed so as to protrude from the main body portion 14c, above the light emitting element (and its surrounding portion).

Also, along with the main body portion and the concave portion, it is preferable if a flange 14b is integrally disposed around the outer periphery of the main body portion. That is, as shown in FIG. 2, it is preferable if the surface of the flange 14b continues from the convex portion 14a, and the flange 14b is disposed at the outer periphery of the main body portion 14c. As will be discussed below, the flange need not be disposed all the way around the convex portion. If the flange is disposed only part of the way around, a flange of substantially the same shape is preferably disposed equidistantly around the convex portion.

As shown in FIG. 2, for example, the main body portion 14c of the translucent member has a width W, a depth, and a height H, and the convex portion 14a has a diameter D and a height T at the place of the maximum value. The flange 14b favorably has the same height as the main body. There are no particular restrictions on the width W, depth, height H, diameter D, or height T here, but it is preferable, for example, for the diameter D of the convex portion to be substantially equal to the width W and/or the depth of the main body. The height T of the convex portion is preferably about 1 to 10 times, and more preferably about 5 to 10 times, the height H of the main body. More specifically, examples include a width W of about 1 to 10 mm, a depth of about 1 to 10 mm, a height H of about 0.05 to 5 mm, a diameter D of about 1 to 10 mm, and a height T of about 0.5 to 6 mm. It is preferable if the width W is about 2 to 7 mm, the depth is about 2 to 7 mm, the height H is about 0.1 to 1 mm, the diameter D is about 2 to 7 mm, and the height T is about 1 to 3 mm. It is particularly favorable for the width W and depth of the main body to be substantially equal (such as within a range of a length of ±5%). This affords equal light distribution in the width direction and in the depth direction. Here, it is preferable if the width and depth of the convex portion are also substantially equal.

Regardless of whether or not the metal member has a concave element placement portion, if the translucent member has a flange, it is good for the flange to be formed so as to be disposed outside of the range of illumination by light emitted from the light emitting element. Preferably, it is disposed more toward the bottom face of the light emitting device (downward) than the range of illumination by light emitted from the light emitting element. The "range of illumination by light emitted from the light emitting element" is the range directly reached by light emitted from the light emitting element. More specifically, it can be defined by a line that links the light emitting layer of the light emitting element and light-blocking members in the surrounding area (such as the metal member). The upper face of the light emitting element may be used as a reference.

In particular, when the light emitting element is placed on a concave element placement portion, the illumination range of the light is defined by the shape, size, etc., of the concave portion of the metal member, but it is good for the surface of the flange to be disposed as close to the flat portion of the metal member as possible so that the flange will be disposed outside the region reached by the light and will not be disposed inside the region passed the light through. That is, the height (position) of the flange upper face of the translucent member is preferably substantially the same height (position) as the upper face of the flat portion of the metal member. In other words, the translucent member preferably covers the metal member and the light emitting element, etc., so that the flange upper face of the translucent member lies in substantially the same plane as the upper face of the flat portion of the metal member.

The phrase "substantially the same height" here means that the upper face of the metal member (and the covering member) present on the inside of the translucent member in plan view is not exposed from the translucent member, but is covered in the minimum possible covering thickness, and only the minimum possible thickness differential is produced when viewed from the side face. Similarly, "substantially the same plane" means that there is only the minimum possible thickness differential, and the plane is either the same or substantially the same. The "minimum possible covering thickness" here means a thickness that can be achieved in the manufacturing process, for example, and more specifically, the thickness of the translucent member on the upper face of the covering member and the flat portion of the metal member is about 50 to 100 μm, with about 70 to 80 μm being preferable. From a different standpoint, it is preferable for the thickness to be about 1/5 to 1/10, and more preferably about 1/5 to 1/7, the height of the flange of the translucent member. When the thickness of the translucent member (such as the flange) at the upper face of the covering member and the flat portion of the metal member is thus at the minimum possible thickness, it is preferable for this thickness to be less than the thickness of the translucent member covering the side faces of the covering member.

The gap between the metal member and the translucent member serves as an entry path for moisture, ionic impurities, and so forth. Therefore, by thus covering the upper face of the metal member with the translucent member, moisture, ionic impurities, and so forth can be prevented from working their way in at the upper face of the light emitting device, and this improves the reliability of the light emitting device.

Disposing or forming the flange in this way ensures the proper contact surface area between the translucent member and the metal member, which prevents separation of the two while allowing the light extraction efficiency to be maximized, without the light from the light emitting element being blocked by the translucent member disposed on the metal member upper face. Also, disposing or forming the flange in this way suppresses total reflection of the light at the surface of the flange, so the absorption of light by the covering member can be prevented. Furthermore, the strength of the translucent member at the flange is improved by the metal member and the covering member, so a relatively thin flange can be formed, and the overall thickness of the light emitting device reduced, while still maintaining good strength. Thus disposing the flange outside the illumination range of light emitted from the light emitting element allows the convex portion surface to serve as the main light extraction face, so in the handling of the light emitting device, pliers or other such equipment can be brought into contact with the flange that is not the main light extraction face. This prevents deformation or damage to the main light extraction face of the light emitting device, and prevents a change in light distribution characteristics or a decrease in light output.

Regardless of whether or not the element placement portion of the metal member has a concave shape, it is good for it to be disposed so that its bottom face is exposed from the bottom face of the main body portion of the translucent member. If a concave portion is disposed, it is good for the bottom face of the concave portion to be exposed from the bottom face of the main body portion. In the latter case, it is preferable for the layout to lie in substantially the same plane as the bottom face of the concave portion. Exposing in the element placement portion in this way allows heat to be effectively dissipated from the light emitting element. As a result, deterioration and so forth of the light emitting element and the translucent member caused by heat can be prevented, and the reliability of the light emitting device can be enhanced. Also, if the bottom face of the translucent member lies in substantially the same plane as the bottom face of the concave portion, the bottom face of the light emitting element is reinforced by the metal member.

Therefore, the height H of the flange and the main body portion is preferably slightly greater (such as +100 μm) than the sum of the thickness of the metal member and the depth of the concave portion.

If the above-mentioned covering member exposes the element placement portion of the metal member and covers the second face side of the flat portion located on the outer periphery thereof, as well as the outer peripheral part of the element placement portion, the translucent member preferably covers at least part of the side face and upper face of the covering member, and more preferably covers all of the side face and upper face of the covering member. Also, the translucent member may covers at least part or all of the bottom face of the covering member. By thus covering the covering member with the translucent member, that is, by covering the hard covering member with the softer (as discussed below) translucent member, external stress on the covering member can be absorbed. As a result, cracking, chipping, and so forth caused by external stress can be prevented, and the strength of the light emitting device can be increased. Also, when the flange and the convex portion have the above-mentioned shape and layout, adhesion between the translucent member and the covering member tends to decrease, but if the translucent member thus covers not just the upper face of the covering member, but all the way to the side face, the contact surface area between the translucent member and the covering member can be increased and adhesion improved. Thus, it is possible to obtain a light emitting device that has the above structure and improved reliability.

It is preferable if the translucent member and/or covering member defining the bottom face of the light emitting device is formed so as to lie in the same plane. This increases the strength of the bottom face of the light emitting device and improves reliability. Also, if a concave portion is formed in the metal member, it is preferable for the translucent member and/or covering member defining the bottom face to coincide with, that is, lie in the same plane as, the concave portion bottom face. This allows the bottom face of the concave portion to be reliably exposed from the sealing member, and improves heat dissipation. Furthermore, the bottom face of the concave portion can be brought into contact with a mounting substrate, and the heat dissipation path can even be used for the mounting substrate, which affords better heat dissipation.

The translucent member is formed from a material that is softer than the above-mentioned covering member. "Softer than the covering member" generally means that the hardness is lower.

Also, it can be said that the translucent member is formed from a material with rubber-like elasticity. Alternatively, it can be said to be formed from a material with a hardness expressed by dynamic hardness (repulsion hardness).

Dynamic hardness is generally expressed as hardness obtained by Shore A hardness or JIS-A hardness test.

The hardness of the translucent member as found by JIS-A hardness test is about 65 or lower, for example, and preferably about 60 or lower. Using a soft material such as this reduces fatigue of the wire in a thermal impact test. Also, in view of prevention of wire bending in the handling of the light emitting device, the sticking together of light emitting devices, and so on, the hardness determined by JIS-A hardness test is at least about 20, and preferably at least about 30. The linear coefficient of thermal expansion of a translucent member with such high elasticity is about 200 to 300 ppm/K, for example.

The phrase "the translucent member is soft" means, for example, that the viscosity during molding (when molten) is lower than that of the covering member. The viscosity during molding will vary with the material, but when the material that constitutes the translucent member is melted at a temperature suited to that material in an ordinary semiconductor process, the viscosity is favorably about 9 Pa·s or less, and preferably about 5 Pa·s or less. Using a material such as this prevents molding defects. When actual manufacturing is taken into account, about 2.5 Pa·s or higher is preferable. For example, a silicone resin whose viscosity at 25° C. is approximately 3 Pa·s can be used.

The translucent member is selected from among materials that can provide electrical insulation between the light emitting element and the metal member.

Therefore, a translucent silicone resin is a favorable example of a material having the above-mentioned hardness and characteristics. Good long-term reliability can be anticipated with this resin because it has rubber-like elasticity, exhibits heat resistance, can withstand high temperatures over 200° C., has a low rate of deformation and decomposition at high temperatures (that is, its temperature dependence is low), and it has little effect on other members.

The translucent member may partially be a mixture obtained by mixing the above-mentioned material with any of various dyes, pigments, or the like as colorants or diffusion agents. Examples include colorants such as $Cr_2O_3$, $MnO_2$, $Fe_2O_3$, and carbon black, and diffusion agents such as calcium carbonate, aluminum oxide, and titanium oxide. It is preferable to use a material into which no colorant or diffusion agent has been mixed. This prevents light scattering by the colorant or diffusion agent, and suppresses total reflection at the surface of the translucent member, so the light extraction efficiency can be improved.

(Translucent Covering Member)

With the light emitting device of the present invention, after the light emitting element has been placed on the metal member, a translucent covering member may be disposed so as to cover the light emitting element. The translucent covering member is usually disposed in contact with the light emitting element. For example, if the metal member has a concave element placement portion, the translucent covering member may be disposed so as to rise up from all or part of the concave portion.

The translucent covering member is preferably formed from a material that will protect the light emitting element from external force, moisture, and the like, and that can protect the wires that connect the light emitting element and the metal member.

Examples of the translucent covering member include epoxy resin, silicone resin, acrylic resin, urea resin, combinations of these, and other such transparent resins with excellent weather resistance, and glass. The translucent covering member may have any hardness. The translucent covering member preferably has the same composition and is made of the same material as the sealing member, but a diffusion agent or a fluorescent substance may be added to this. Using the same material as the sealing member allows the sealing member and the translucent covering member to have substantially the same coefficient of thermal expansion. Therefore, the impact resistance of wires and so forth disposed over the sealing member and the translucent covering member can be improved. Furthermore, since the refractive index is also substantially equal, less light is lost in passing from the translucent covering member to the sealing member, so the light extraction efficiency can be improved. The translucent covering member may be made from a different material, have a different composition, etc. In particular, with a transparent resin, even if moisture goes into the translucent covering member during processing or storage, the moisture contained in the resin can be release to the outside atmosphere by baking for at least about 14 hours at about 100° C. Therefore, steam explosion and separation of the light emitting element and the above-mentioned translucent resin can be prevented. In view of adhesion and the like between the translucent member and the translucent covering member under the effect of heat produced by the light emitting element and so forth, the translucent covering member is preferably selected so that there will be little difference in the coefficient of thermal expansion between the two.

The translucent covering member may contain a diffusion agent or a fluorescent substance. A diffusion agent is used to diffuse light, and can moderate the directionality from the light emitting element, and increase the viewing angle. A fluorescent substance is used to convert light from the light emitting element, and can convert the wavelength of the light emitted from the light emitting element to the outside of the sealing member. If the light from the light emitting element is visible light with a short wavelength and high energy, then a perylene derivative (an organic fluorescent substance), ZnCdS:Cu, YAG:Ce, Eu- and/or Cr-activated nitrogen-containing $CaO—Al_2O_3—SiO_2$, or another such fluorescent substance can be used to advantage. With the present invention, when white light is to be obtained, and particularly when a YAG:Ce fluorescent substance is utilized, depending on the content thereof, it is possible to emit light from a blue light emitting element and complementary yellow light by absorbing some of this blue light, making it relatively simple to obtain white light reliably. Furthermore, when an Eu- and/or Cr-activated nitrogen-containing $CaO—Al_2O_3—SiO_2$ fluorescent substance is jointly used, depending on the content thereof, it is possible to emit red light in addition to light from a blue light emitting element and complementary yellow light by absorbing some of this blue light, making it relatively simple to reliably obtain white light with improved color rendering.

The diffusion agent and fluorescent substance are preferably contained in just the translucent covering member, and not in the translucent member. This prevents light from escaping to the bottom face side or the side faces of the light emitting device due to light scattering caused by the diffusion agent or fluorescent substance. The translucent covering member can be molded by being packed in a concave portion as discussed above, and may be formed only around the light emitting element by screen printing, electrophoretic deposition, or the like. Here, the translucent covering member may be constituted by a fluorescent substance alone.

(Protective Element)

There are no particular restrictions on the protective element, which may be any known type that is mounted in a light emitting device. For example, it can be an element that can short-circuit reverse voltage applied to the light emitting element, or short-circuit forward voltage over the specified voltage, that is higher than the operating voltage of the light emitting element. More specifically, it can be a Zener diode, a transistor diode, or the like.

With the light emitting device of the present invention, the protective element is preferably placed outside the illumination range of light emitted from the light emitting element. This suppresses light absorption by the protective element. Also, the protective element is preferably placed on a metal member that is isolated from the metal member provided with the light emitting element placement portion, and from the metal member to which the wires of the light emitting element are connected. Furthermore, it is preferably placed on a metal member disposed at a location that is lower than the uppermost face of the metal member provided with the light emitting element placement portion (see FIG. 1B). This prevents the joining member of the protective element from flowing to the light emitting element or to the portion where the wires thereof are connected.

The protective element may be placed on the first metal member (the metal member on which the light emitting element is placed). In this case, the joining member of the protective element can be prevented from flowing out toward the concave portion by having the protective element be placed on the first metal member and at a location opposite the light emitting element, with a recess in between. Usually just one protective element is installed, but two or more may be installed.

(Other Parts)

The light emitting device of the present invention may comprise a reflective member, anti-reflective member, light diffusion member, or any of various other such parts in order to extract light more efficiently from the light emitting element.

(Method for Manufacturing Light Emitting Device)

Because today's light emitting devices need to be smaller and thinner, in their manufacture, such as in their manufacture by molding in which a metal member is clamped between upper and lower molds (dies) that form a cavity, and a sealing member is injected into this cavity, with the light emitting device of the present invention the surface area of the metal member clamped between the upper and lower molds is dramatically reduced in size. Because of this, the metal member tends to float (gap, displacement, etc.) within the upper and lower molds, and it is difficult to securely fix the metal member in the upper and lower molds. In particular, when a concave portion and a bent portion are formed in the metal member and these are embedded in a sealing member in order to improve adhesion between the metal member and the sealing member, it is generally even more difficult to securely fix the metal member in the upper and lower molds. Also, because the properties of the above-mentioned translucent member are such that its viscosity is extremely low during molding, it penetrates into the tiny gaps between the metal member and the molds in which it is clamped. Consequently, a thin film was sometimes formed by the translucent member even at portions of the metal member functioning as an external terminal. Furthermore, because of its properties, once a thin film of the translucent member has been formed at unintended locations, it cannot be reliably removed by blasting or other such simple etching procedures.

In view of this, with the present invention, particularly when using the above-mentioned translucent member that is relatively soft or has a low viscosity during molding, a covering member that is relatively hard or has a high viscosity during molding is disposed ahead of time on the second face side of the flat portion of the metal member, and preferably at the outer periphery of the flat portion. The integrated metal member and covering member subsequently increase the contact surface area between the upper and lower molds and these metal members, etc., during the molding of the translucent member, thereby securely fixing them in the upper and lower molds. This avoids penetration of the translucent member to unnecessary areas during molding and prevents the undesirable formation of a thin film on the external terminals of the metal member, etc., which affords a higher yield and boosts manufacturing efficiency.

Because of this, the method of the present invention for manufacturing a light emitting device comprises the steps of:

(a) disposing in molds a metal member having an element placement portion on which a light emitting element is placed on a first face, and a flat portion disposed around the element placement portion, and forming a covering member that covers at least a second face side of the flat portion of the metal member;

(b) mounting a light emitting element on the element placement portion of the metal member; and (c) disposing the metal member covered by the covering member inside second molds, clamping the upper face and lower face of the covering member with the second molds, and thereby forming a translucent member that covers the side faces and upper face of the covering member and part of the metal member.

(Step (a))

The metal member is disposed in molds and a covering member is formed.

As mentioned above, the metal member has an element placement portion on which a light emitting element is placed on a first face, and a flat portion disposed around the element placement portion. The covering member covers at least a second face side of the flat portion of the metal member.

As discussed above, the covering member used here is favorably made from a relatively hard resin so that when the metal member is clamped between the upper and lower molds, even if the contact surface area between these is small and the metal member is not sufficiently fixed, and if a gap is therefore present at the clamped portion between the metal member and the upper and lower molds, there will be no penetration into this gap. That is, it is good for the viscosity of the covering member material during the molding of the covering member to be higher than the viscosity of the translucent member material during the molding of the translucent member.

Consequently, as mentioned above, the covering member will not penetrated into the gap between the molds and the metal member they are clamping, and as will be discussed below, when the metal member is clamped by second molds, the contact surface area can be increased between at least one of the second molds and the metal member (strictly speaking, the metal member and the covering member). As a result, fixing and clamping can be accomplished more stably, and even in molding with a resin that is soft or has a relatively low viscosity, the formation of a thin film of the sealing member at unintended locations of the metal member can be effectively prevented.

(Step (b))

A joining member is usually used in mounting the light emitting element to the metal member. For example, an epoxy resin, silicone, or the like can be used with a light emitting element that emits blue and green light and is produced by growing a nitride semiconductor on a sapphire substrate. When deterioration caused by heat or light from the light emitting element is taken into account, a metal layer of aluminum or the like may be provided ahead of time to the rear face of the light emitting element, or no resin may be used and Au—Sn eutectic solder or other such solder, or a low-melting point metal or other such braze may be used. With a light emitting element in which electrodes are formed on both sides, such as a light emitting element that emits red light and is composed of GaAs or the like, die-bonding may be performed with a conductive paste of silver, gold, palladium, or the like.

Just one light emitting element may be mounted on one metal member, or two or more may be mounted.

Also, the light emitting element may be placed on the metal member via a support (sub-mount). For example, a support made of ceramic is molded in the required shape and then fired. Conductive wiring that is connected to the light emitting element is provided on the upper face side of the support. The conductive wiring is usually formed, for example, by vapor deposition or sputtering and photolithography, or by printing or the like, or by electroplating or the like. The conductive wiring may be provided inside the support. The conductive wiring is formed, for example, from a paste-like material obtained by adding a high-melting point metal such as tungsten or molybdenum to a resin binder. The paste-like material is put in the desired shape via through-holes provided to a green sheet by screen printing or another such method, and then fired to form conductive wiring disposed on the ceramic support and on the surface or in the interior thereof. Also, the support may be insert molded with resin, using a pair of positive and negative lead electrodes as conductive members. A light emitting element may be placed on the upper face of this support and electrically connected to the conductive wiring of the support. When a support such as this is used, the conductive wiring of the support is electrically connected to the metal member (discussed below).

The light emitting element may be mounted face-down, in which case the use of the above-mentioned support is preferable. That is, the light emitting element is preferably mounted face-down on the support, and the conductive wiring of the support connected by wire to the metal member.

Step (b) may be performed prior to step (a), as long as it is performed prior to step (c).

After step (b), and before step (c), the entire surface of the light emitting element is preferably covered with a translucent covering member.

This translucent covering member is preferably formed by a simple method such as potting, for example. With this method, undesirable pressure caused by the translucent covering member is not exerted on the light emitting element, as is the case with mold forming, so breakage of the wires, etc., can be effectively prevented. Also, the light emitting element, its surroundings, or the inside of the concave portion can be easily covered by suitably adjusting the amount of resin used during potting.

(Step (c))

The metal member covered by the covering member is disposed inside the second molds, and a translucent member that covers part of the metal member and the upper face and side faces of the covering member is formed. The upper and lower faces of the covering member are clamped by the second molds.

In step (a) above, when the first face of the flat portion is exposed to form the covering member, it is preferable the first face of the flat portion and the upper face of the covering member, and the lower face of the covering member are clamped by the second molds, respectively, in step (c).

When the bottom face of the element placement portion is exposed to form the covering member in step (a), then in step (c) it is preferable to form the translucent member that exposes the bottom face of the element placement portion by suitable clamping with the second molds.

The translucent member used here can be one of the above-mentioned relatively soft resins, such as a material that is softer than the covering member. The viscosity of the translucent member during the formation of the translucent member is preferably lower than the viscosity of the covering member during the formation of the covering member.

This allows the formation of a translucent member composed of at least a main body portion and a convex portion, and which covers at least part of the covering member and part of the metal member and the light emitting element.

A translucent member thus disposed at a suitable location avoids the formation of a thin film at an unintended location, and covering the covering member prevents cracking, chipping, and so forth caused by the hardness of the covering member.

Examples of the light emitting device of the present invention and a method for its manufacture will now be described in detail through reference to the drawings.

Embodiment 1

(Light Emitting Device)

As shown in FIGS. 1A to 1D, the light emitting device 10 in this embodiment is a surface mount type of light emitting device, and mainly comprises light emitting elements 11, a metal member 12 and a second metal member 13, a covering member 15 composed of polyphthalamide (PPA) that covers part of the metal member 12 and the second metal member 13, and a translucent member 14 composed of silicone resin.

The light emitting elements 11, the metal member 12, and the second metal member 13 are integrally sealed by the covering member 15 and the translucent member 14.

The light emitting elements 11 are produced by laminating an n-type contact layer composed of n-type GaN, a light emitting layer composed of GaN, InGaN, AlGaN, InGaAlN, or another such nitride semiconductor, a p-type clad layer composed of p-type AlGaN or InGaN, and a p-type contact layer composed of p-type GaN, in that order, on a sapphire substrate to form a GaN-based semiconductor that emits blue light with a main wavelength of approximately 470 nm.

The die-bonding of the light emitting elements 11 is done using silver paste or an epoxy resin, for example. Also, the flat portion of the metal member 12 is connected to electrodes (see FIG. 1C) formed on the light emitting elements 11, by gold wires with a diameter of 30 μm.

As shown in FIG. 3, the metal member 12 has a concave element placement portion 12a for mounting the light emitting elements 11, and a flat portion 12d is disposed around this. The concave element placement portion 12a has a diameter of about 2.4 mm, for example.

The second metal member 13 is disposed so as to be opposite the element placement portion 12a of the metal member 12.

The metal member 12 and the second metal member 13 have a bent portion 12e that is bent toward the bottom face at about 60° within the covering member 15 and/or the translucent member 14 or within a flange 14b (discussed below), and also have a bent portion 12f that is bent toward the side face at about 120°. Thus, the ends thereof are the side faces of the translucent member 14 and the covering member 15, protrude so as to lie in substantially the same plane as the bottom face of the light emitting device 10, and are constituted so as to function as external terminals.

The metal member 12 and the second metal member 13 are formed by using a press to punch out a silver-plated copper sheet with a thickness of 0.25 mm, for example. The height differential produced by the two-stage bending of the metal member 12 here is about 0.35 mm.

As shown in FIG. 1D (the light emitting elements 11 are not shown), the light emitting elements 11 in the concave element placement portion 12a of the metal member 12 are embedded in a translucent covering member 17 composed of a silicone resin containing a fluorescent substance (such as YAG:Ce) and a diffusion agent (such as titanium oxide). The translucent covering member 17 is formed by potting.

As shown in FIGS. 1B, 1C, and 1D, for example, the covering member 15 exposes the bottom face of the element placement portion 12a of the metal member 12, covers the outer periphery of the element placement portion 12a (the second face of the flat portion 12d of the metal member 12), also covers the outer periphery of the flat portion of the metal member 12, and part of it is formed all the way to the first face side of the metal member 12. The covering member 15 also covers part of the second face of the second metal member 13, and is disposed between the metal member 12 and the second metal member 13. The upper face of the covering member 15 in this case lies in the same plane and coincides with the first face of part of the second metal member 13 and the first face of the flat portion 12d of the metal member 12.

The PPA used for the covering member 15 is harder than the translucent member. Also, its linear coefficient of thermal expansion is a few dozen ppm/K, for example.

As shown in FIGS. 1A and 2 in particular, the translucent member 14 mainly embeds these integrally, and comprises a substantially cuboid main body portion 14c, a lens-shaped convex portion 14a that is disposed on the main body portion 14c and above the light emitting elements 11, and a flange 14b that is disposed around the outer periphery of the flange 14b. In particular, the side face and upper face of the covering member 15 are covered entirely by the translucent member 14 (see FIG. 5B).

Also, as shown in FIG. 2, the main body portion 14c of the translucent member 14 has a width W of about 5 mm, a depth of about 5 mm, and a height H of about 0.6 mm. The convex portion 14a has a diameter D of about 4.7 mm and a height T of about 2.15 mm.

The length along one side of the light emitting device 10, that is, the length along one side of the main body portion 14c of the translucent member 14 (width W=depth), is substantially the same as the diameter D of the convex portion. Therefore, in plan view, the flange 14b is only disposed at four diagonally opposite places on the outer periphery of the main body portion 14c.

The silicone resin used for the translucent member 14 is softer than the covering member 15, and its hardness is about 50 to 60 on the JIS-A hardness scale, for example. The linear coefficient of thermal expansion coefficient thereof is about 200 to 300 ppm/K, for example.

Other locations of the convex portion 14a, namely, the first face of the second metal member 13 and the flat portion 12d of the metal member 12 within the flange 14b, are covered by the translucent member 14, but the covering here is adjusted so as to achieve the minimum thickness. For instance, the film thickness is about 75 μm. With a film thickness such as this, that is, if the upper face of the translucent member 14 is disposed in substantially the same plane as the flat portion of the metal member 12, or if the height of the upper face of the translucent member 14 from the bottom face of the light emitting device substantially coincides with the height of the upper face of the flat portion 12d of the metal member 12, then the disposition will be outside the illumination range of the light, so the light from the light emitting element will not be blocked.

Also, since the translucent member 14 substantially covers the side faces and the upper face of the covering member 15, cracking, chipping, and so forth caused by the hardness of the covering member 15 can be effectively prevented. The linear coefficients of thermal expansion of the metal members 12 and 13 can be brought close together by using a material for the covering member 15 that has a smaller linear coefficient of thermal expansion than the translucent member 14. Therefore, separation and cracking during temperature changes can be suppressed, and a light emitting device with enhanced reliability can be obtained.

(Method for Manufacturing Light Emitting Device)

Figure 4A:
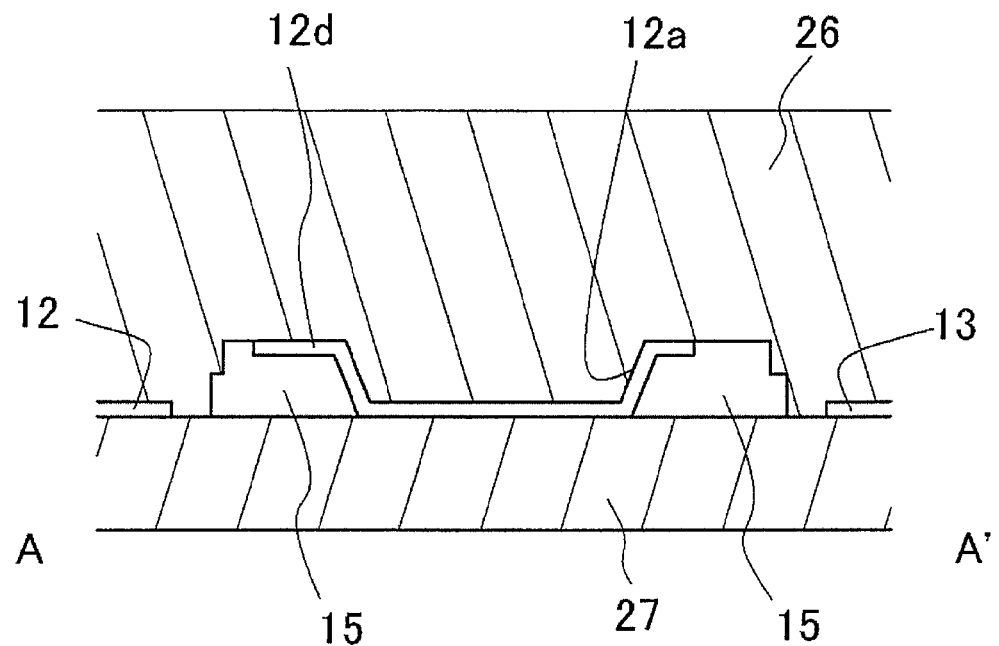
FIG. 4A is a simplified manufacturing step cross section illustrating the formation of a covering member 15 in the light emitting device of the present invention (corresponds to the A-A' line cross section in FIG. 4B)
Figure 4B:
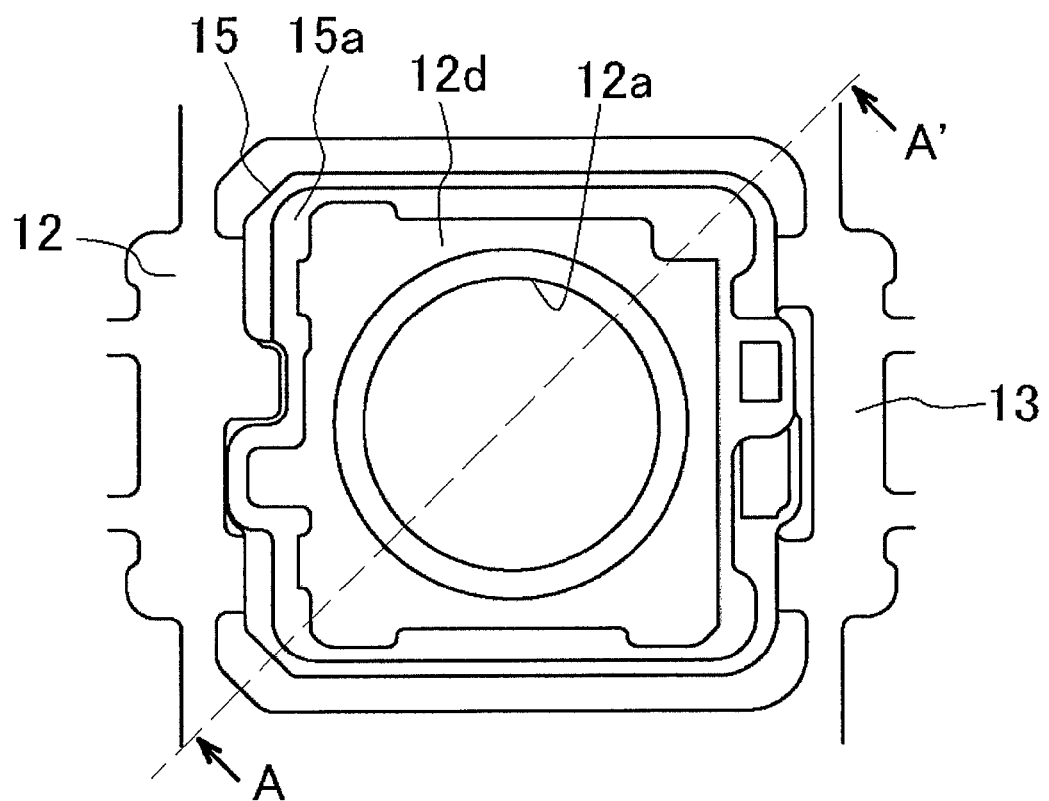
FIG. 4B is a simplified manufacturing step cross section illustrating the formation of the covering member 15 in the light emitting device of the present invention.

First, a metal sheet is punched and bent by known methods to prepare metal members that will serve as the second metal member 13 and the metal member 12 having the flat portion 12d and the element placement portion 12a (see FIG. 4B).

As shown in FIGS. 4A and 4B, the metal members serving as the metal member 12 and the second metal member 13 are disposed in the upper and lower molds 26 and 27. The lower mold 27 comes into contact with the bottom face of the concave portion (the element placement portion 12a), and at the same time comes into contact with the bottom face of the metal member extending to the side and serving as an external terminal. The upper mold 26 comes into contact with the upper face of the concave portion and the flat portion 12d of the metal members serving as the metal member 12 and the second metal member 13. The inside of the concave portion is a cavity into which the covering member (discussed below) is not injected. The upper mold 26 comes into contact with the lower mold 27 at a portion where the covering member 15 is not formed.

The resin that will make up the covering member 15 is injected into the molds 26 and 27 in a state in which the metal members 12 and 13 have been fixed. The resin in this case is usually a PPA resin, which is relatively hard and is well known as a sealing member for use in a semiconductor device. The resin is then cured and taken out of the mold.

This sealing of the covering member forms a covering member that covers the flat portion and its outer periphery on the second face side of the metal member. As shown in FIG. 4B, etc., this covering member lies in substantially the same plane as the first face of the metal member in the region extending to the outer periphery of the flat portion of the metal member (see 15a in FIGS. 1B and 4B), but a step may also be formed at the outer periphery thereof. The bottom face of the covering member is substantially the same as the second face (lower face) of the terminal and the concave portion.

Then, the light emitting elements 11 are mounted by a known method in the concave portion formed as part of the metal member 12, and electrical connections are made by wire bonding. When a protective element is installed, it is installed and wire bonded before, after, or simultaneously with the mounting of the light emitting elements.

The translucent covering member 17 containing a fluorescent substance is then potted inside the concave portion to cover the light emitting elements 11.

Figure 5A:
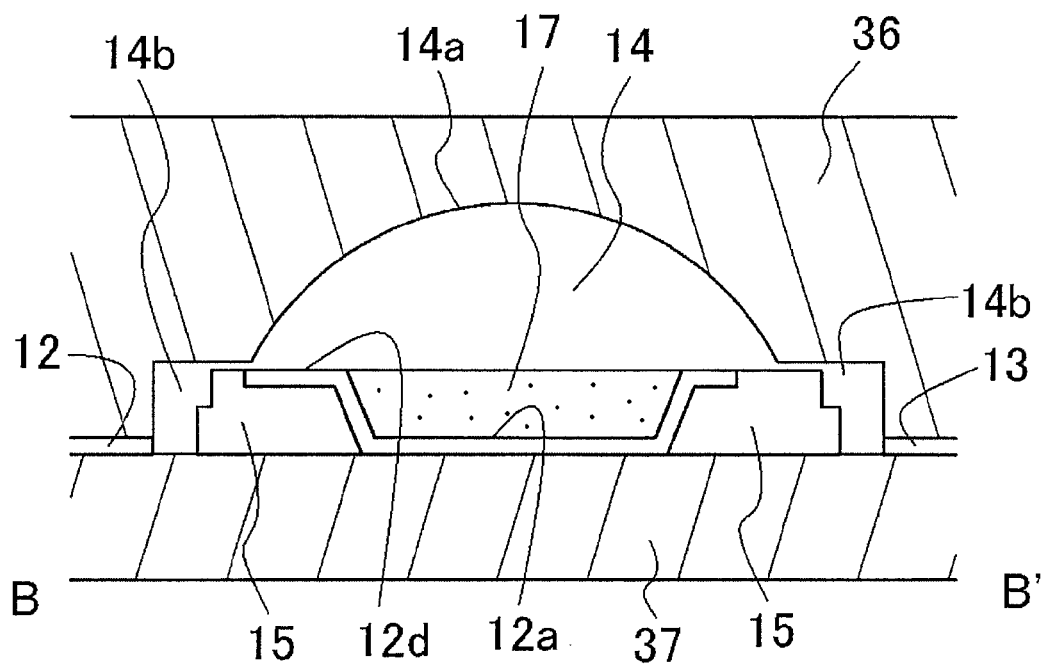
FIG. 5A is a simplified manufacturing step cross section illustrating the formation of the translucent member 14 in the light emitting device of the present invention (corresponds to the A-A' line cross section in FIG. 5B)
Figure 5B:
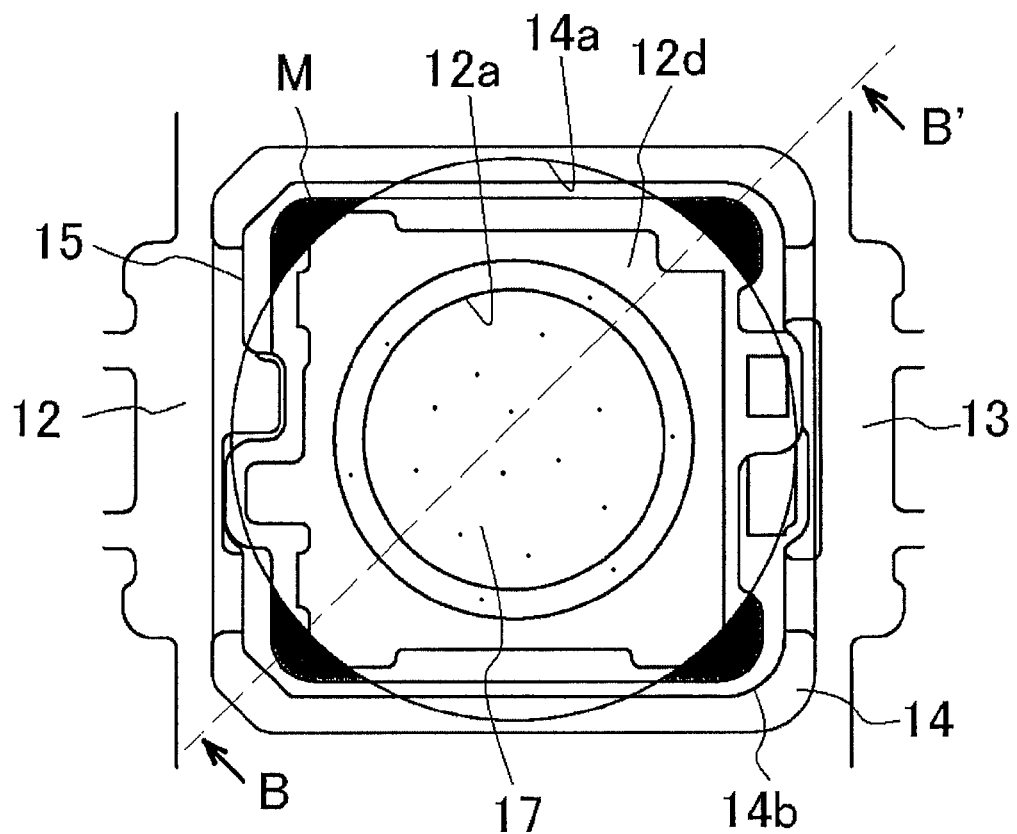
FIG. 5B is a simplified manufacturing step cross section illustrating the formation of the translucent member 14 in the light emitting device of the present invention.

Next, as shown in FIGS. 5A and 5B, the metal members thus obtained are disposed inside second upper and lower molds 36 and 37. The cavity is filled with the translucent covering member 17. Although not shown in FIG. 5A, the light emitting elements 11 are mounted in the cavity filled with the translucent covering member 17.

The lower mold 37 comes into contact with the bottom face of the flat portion 12d, and at the same time, comes into contact with the bottom face of the metal member serves as an external terminal and extending to the side, and also comes into contact with the bottom face of the covering member. The upper mold 36 comes into contact with the flat portion 12d of the metal members serving as the metal member 12 and the second metal member 13, and at the same time, comes into contact with part of the upper face and the side face of the previously sealed covering member 15 (see M in FIG. 5B). The resin that will make up the translucent member is injected into the mold in a state in which the metal members have been fixed. The resin in this case is a silicone resin that is relatively soft, for example.

Figure 6:
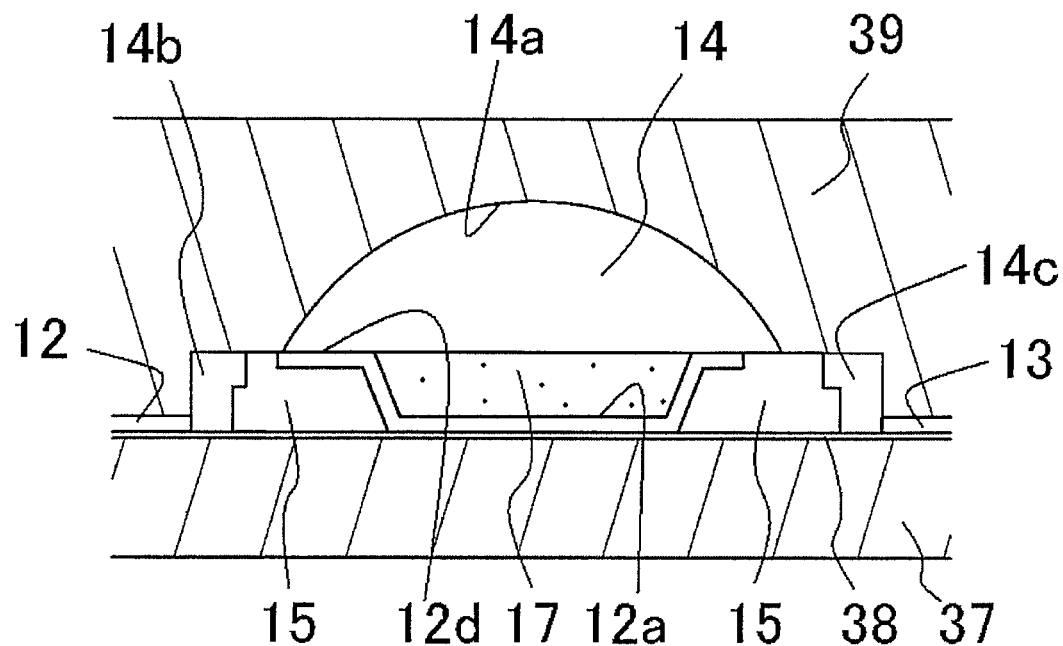
FIG. 6 is another simplified manufacturing step cross section illustrating the formation of the translucent member 14 in the light emitting device of the present invention (corresponds to the A-A' line cross section in FIG. 5B)

A tiny gap is provided between the upper mold 36 and the upper face of the covering member 15 in FIG. 5A, but as shown in FIG. 6, it is preferable if the upper face of the covering member 15 comes into complete contact with an upper mold 39. In this case, if a material with a low viscosity is used as the material for the translucent member 14, the material of the translucent member 14 will penetrate between the upper mold 39 and the covering member 15, forming the translucent member 14 that continuously covers the upper face and side faces of the covering member 15. Furthermore, it is preferable for a release film 38 to be sandwiched between the bottom face of the covering member 15 and the metal members 12 and 13 and the lower mold. This affords a structure with which the translucent member 14 is easily formed between the upper mold 39 and the covering member 15, and the translucent member 14 is not formed between the covering member 15 and the metal members 12 and 13 and the lower mold 37.

The release film 38 is used so that the resin can be easily parted from the mold. The material of this film is one that has the required heat resistance and has good release properties with the mold and the resin, such as an FEP sheet film or a PET sheet film. After this, the resin is cured and taken out of the mold.

This sealing of the translucent member can form a translucent member 14 composed of the main body portion 14c, the convex portion 14a, and the convex portion 14a, covering at least part of the covering member 15 and part of the metal members and the light emitting elements (not shown).

Finally, the metal members are cut to obtain the light emitting device 10 shown in FIGS. 1A to 1D.

Thus, by covering the outside of a hard sealing member with a sealing member that is soft and elastic, even if the light emitting device should be dropped, or if light emitting devices should hit each other inside a bag or box during shipment of the light emitting devices, the soft sealing member will absorb the impact force and effectively prevent the cracking, chipping, and so forth of the covering member.

The light extraction efficiency can also be improved.

In other words, with a light emitting device in which a translucent member is used, since the translucent member covering the metal members transmitted light from the light emitting element, that light was sometimes extracted in a direction other than the front face direction, which is the light extraction face of the light emitting device. However, even though the translucent member is formed from a translucent material, some of the light is absorbed by the material of the translucent member and depending on the shape, etc.

In contrast, with the light emitting device of the present invention, the translucent member on the metal member is kept to the minimum possible film thickness at the flange of the sealing member, that is, the upper face of the flange is provided close to the covering member and the flat portion of the metal member, so the flange is disposed outside the illumination range of light from the light emitting element. Therefore, this light is not extracted after passing through the flange. As a result, the extraction of light from the light emitting element can be converged on the convex portion, and the light extraction efficiency of the light emitting device can be greatly improved.

Also, the light extraction efficiency was simulated with two types of light emitting device with different cover film thickness of the flat portion of the metal member at the flange, and the size of the convex portion. As a result, it was confirmed that the light extraction efficiency increased when the diameter of the convex portion was increased and the cover film thickness of the flat portion at the flange was reduced.

More specifically, the light extraction efficiency was 95.2% for a first light emitting device in which the length along one side of the light emitting device (the length along one side of the main body portion of the sealing member) was about 5 mm, the diameter of the lens-shaped convex portion was about 5 mm, the height of the flange was about 0.5 mm, and the cover film thickness of the flat portion of the flange was about 75 μm.

The light extraction efficiency was 88.1% for a second light emitting device in which the length along one side of the light emitting device was similarly 5 mm, the diameter of the lens-shaped convex portion was about 3.5 mm, the height of the flange was about 0.85 mm, and the cover film thickness of the flat portion of the flange was about 0.35 mm.

It was thus confirmed that the light extraction efficiency of the first light emitting device was approximately 8% higher than that of the second light emitting device.

Furthermore, adhesion between the translucent member and the metal member can be increased. That is, as discussed above, if the flange is provided close to the covering member and the flange, the flange will be thinner, so this can lead to a decrease in the strength of the flange and the adhesion between the translucent member and the metal member and covering member. In particular, the material of the translucent member is more elastic than the material of the covering member, and tends to deform more readily under elevated temperature, external force, and so on, so adequate adhesion and strength are hard to obtain. If there is not enough adhesion between the metal member and the translucent member, a gap between the metal member and the translucent member will serve as a path through which moisture, ionic impurities, and so forth can penetrate, which compromises the reliability of the light emitting device.

In contrast, with the light emitting device of the present invention, the metal member is bent inside the covering member or inside the translucent member (and particularly near the flange), which allows the contact surface area between the sealing member and the metal member to be increased. Also, fixing of the metal member by bending can be reinforced, and adhesion between the metal member and the sealing member can be improved. Furthermore, the strength of the flange can also be increased, allowing the reliability of the light emitting device to be enhanced. In addition, since the flange is formed thinner while its strength is maintained, the height of the light emitting device can be reduced.

In the past, as light emitting devices became smaller and thinner, in their manufacture, in the course of mold molding in which a metal member was clamped between upper and lower molds and a sealing member was injected into this cavity, the surface area of the metal member clamped between the upper and lower molds was dramatically reduced in size, so the metal member tended to float within the upper and lower molds. Because of this, it was difficult to securely fix the metal member in the upper and lower molds. Also, because the properties of the above-mentioned translucent member were such that its viscosity was extremely low during molding, it would penetrate into the tiny gap between the metal member and the molds in which it was clamped. Consequently, an undesirable thin film was sometimes formed by the translucent member even at portions of the metal member functioning as an external terminal. Furthermore, because of its properties, once a thin film of the translucent member was formed at unintended locations, it could not be reliably removed by blasting or other such simple etching procedures.

On the other hand, with the embodiment given above, a specific location on the second face side of the metal member, which does not affect the extraction light whatsoever, is covered by a covering member with a relatively high hardness (a relatively high viscosity during molding) prior to the formation of the translucent member, which has a relatively low hardness (a relatively low viscosity during molding). After this, even those the metal member is clamped in the upper and lower molds to form the translucent member, since the upper and lower molds can clamp along with part of the covering member that has been formed, the metal member (and the covering member) can be clamped by the upper and lower molds with sufficient force. Thus, even though the translucent member is formed using a soft resin with a low viscosity and relatively low hardness, the resin can be prevented from penetrating at unnecessary locations, and the formation of a thin film at unintended locations of the metal member can be prevented. This makes it possible to prevent a decrease in yield and to improve the manufacturing efficiency.

Embodiment 2

Figure 7:
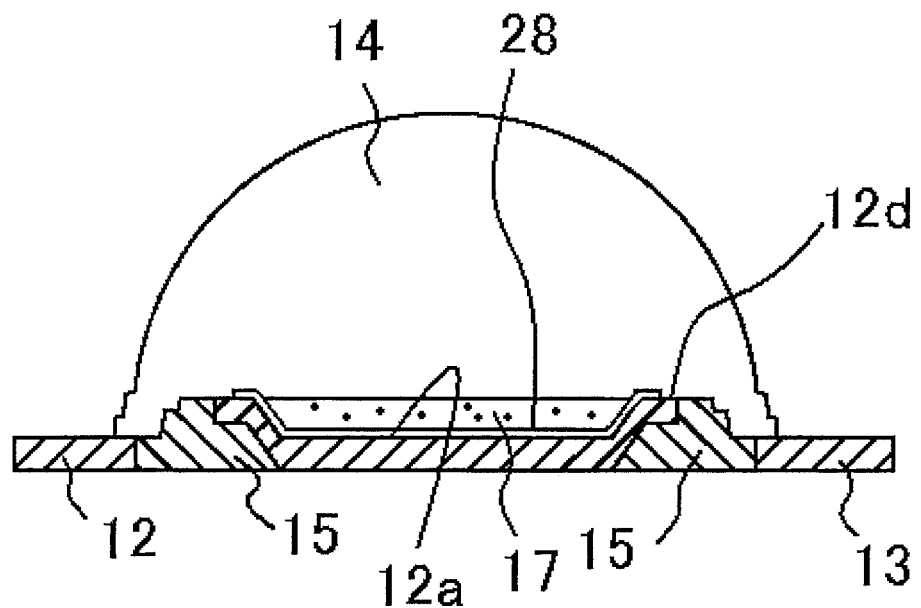
FIG. 7 is a simplified cross section of the main portions in another embodiment of the light emitting device of the present invention (corresponds to the E-E' line cross section in FIG. 1C)

As shown in FIG. 7, the entire surface of a metal member 12 and second metal member 13 composed of copper sheets was plated with gold in a thickness of 0.005 μm, after which the entire inner face of the element placement portion 12a (diameter of about 3.0 mm) and the outer periphery (width of about 0.2 mm) of the element placement portion 12a all the way to the flat portion were given a silver plating film 28 with a thickness of 3 μm. The silver plating film 28 inside the element placement portion 12a was covered by the translucent covering member 17, but the silver plating film 28 formed on the outer periphery was exposed from the translucent covering member 17 and in contact with the translucent member 14.

Because the wire bonded portion was plated with gold, which has better adhesion to the wire than silver, adhesion between the wire and the metal member can be improved. Furthermore, adhesion between the translucent member 14 and the metal member can be further improved due to the better adhesion of silver to the resin as compared to that of gold.

The same effects are obtained with this embodiment as in Embodiment 1.

Embodiment 3

Figure 8A:
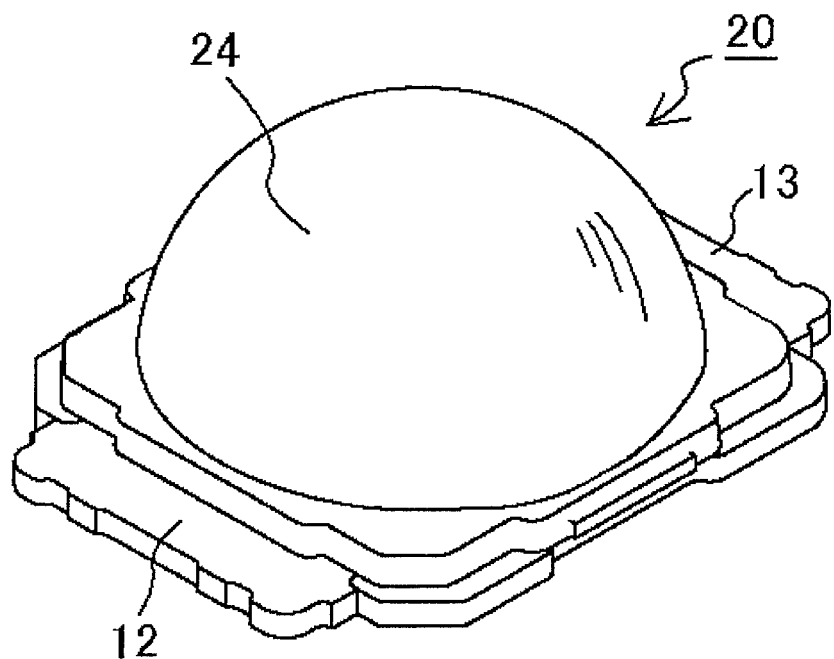
FIG. 8A is an oblique view of the outer shape of another translucent member 24 in the light emitting device of the present invention.
Figure 8B:
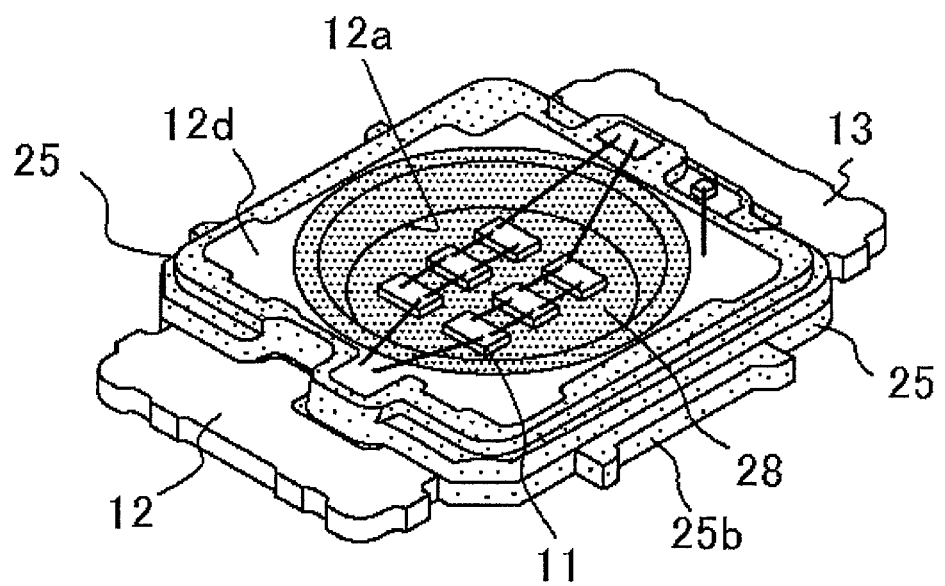
FIG. 8B is an oblique view of when the translucent member has been removed from the light emitting device in FIG. 8A.

As shown in FIGS. 8A and 8B, this light emitting device has substantially the same constitution as that in Embodiment 2, except for the shape of a translucent member 24 and a covering member 25, and can be manufactured by the same manufacturing method.

Figure 8C:
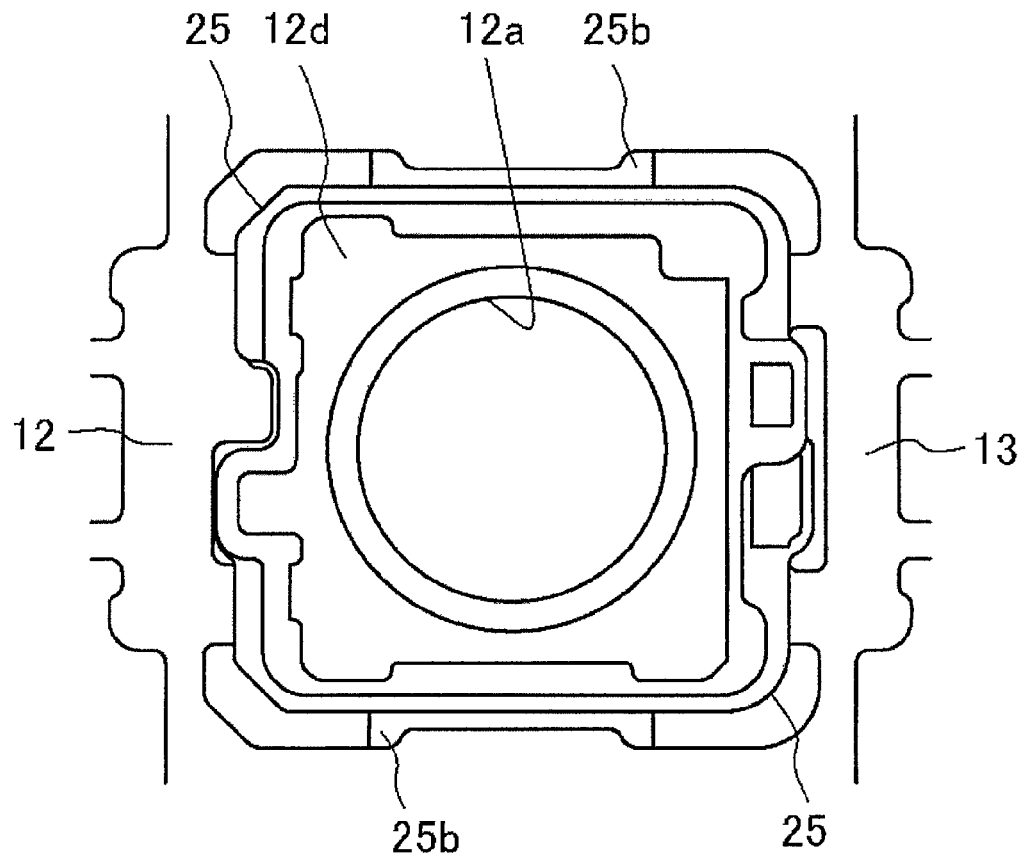
FIG. 8C is a simplified manufacturing step plan view illustrating the formation of another covering member 25 in the light emitting device of the present invention.

The translucent member 24 is formed in a shape that conforms to a step at the outer periphery of the covering member 25, and protrusions 25b are formed on the side faces of the covering member 25 (see FIG. 8C).

Providing these protrusions 25b allows the protrusions 25b to be fixed by the metal members 12 and 13, and allows the metal members 12 and 13 and the covering member 25 to be more stably fixed in the formation of the translucent member 24. Consequently, the translucent member 24 is further hindered from going around to the rear faces of the metal members 12 and 13.

The same effects are obtained with this embodiment as in Embodiments 1 and 2.

Embodiment 4

As shown in FIG. 9, this light emitting device has substantially the same constitution as that in Embodiment 1, except that a hole 12b and a cut-out 12c are formed in the flat portion 12d of the metal member 12 in order to achieve adhesion with the covering member 15, and can be manufactured by the same manufacturing method.

The same effects are obtained with this embodiment as in Embodiment 1.

Embodiment 5

Figure 10:
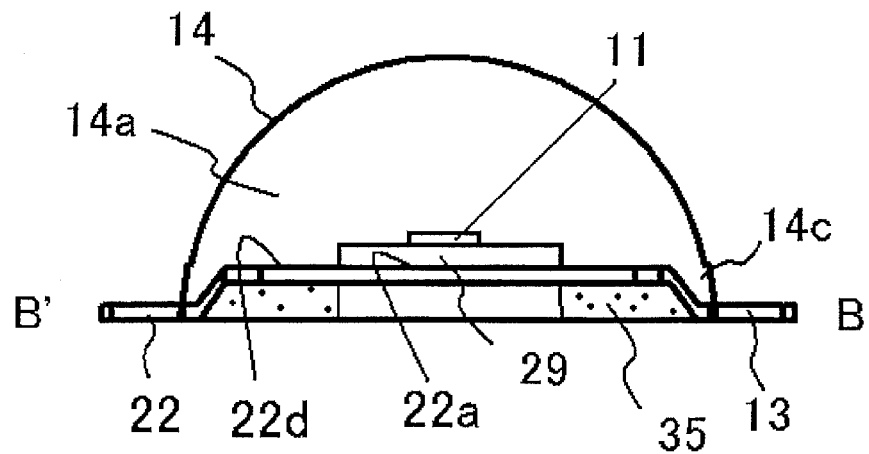
FIG. 10 is a simplified cross section of the main portions in another embodiment of the light emitting device of the present invention (corresponds to the E-E' line cross section in FIG. 1C)
Figure 11:
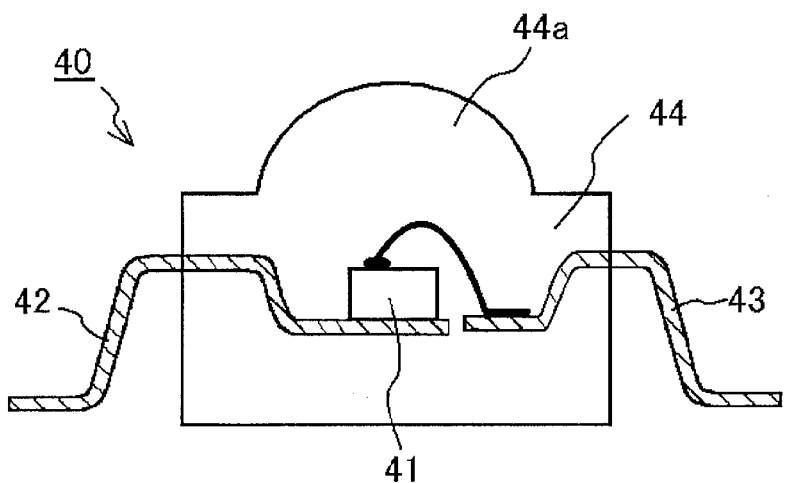
FIG. 11 is a simplified cross section of a conventional light emitting device.
Figure 12:
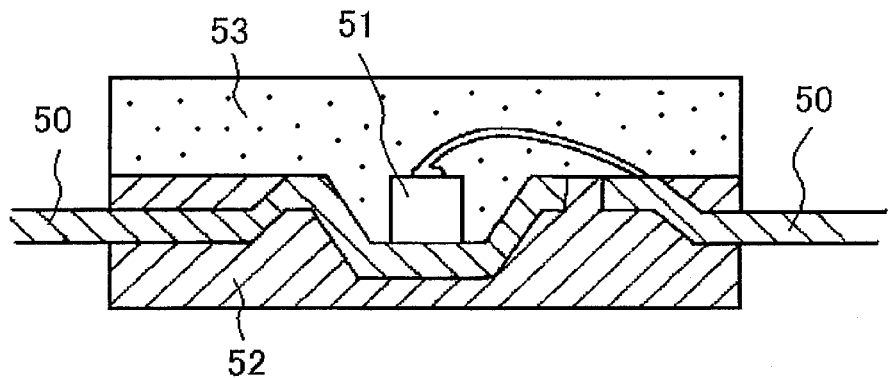
FIG. 12 is a simplified cross section of another conventional light emitting device.

As shown in FIG. 10, the constitution here is substantially the same as that in Embodiment 1, except that an element placement portion 22a does not have a concave portion, the light emitting elements are placed on a flat portion that is continuous with a flat portion 22d, the light emitting elements 11 are put in place via a ceramic support 29, and a covering member 35 is disposed on the second face side of a metal member 22 in a region (a region corresponding to the flat portion 22d) other than the region corresponding to the region in which the support 29 is mounted (element placement portion 22a). The upper face of the flange 14b of the translucent member 14 is disposed at a location lower than the upper face of the support 29.

When the support 29 is thus provided, the flange 14b is disposed outside the illumination range of light emitted from the light emitting elements.

With a light emitting device thus constituted, there is a slight increase in the half-value angle, but good emission efficiency is obtained.

Also, part of the flat portion may protrude into the convex portion, and the element placement portion may be disposed at a location that is higher than the flange. In this case the support can be omitted.

The light emitting device of this embodiment can also be manufactured in substantially the same manner as in Embodiment 1.

The same effects are obtained with this embodiment as in Embodiment 1.

The present invention can be used in various kinds of light source, such as illumination light sources, various indicator light sources, automotive light sources, display light sources, liquid crystal backlight light sources, signaling devices, automotive parts, and signage channel letters.

What is claimed is:

1. A light emitting device, comprising:
a light emitting element; a metal member having a first face and a second face on an opposite side from the first face, the first face having an element placement portion and a flat portion disposed around the element placement portion with the light emitting element being mounted on the element placement portion;
a covering member disposed on the second face of the metal member at the flat portion outside an illumination range of light emitted from the light emitting element, a top face of a portion of the covering member adjacent to the metal member being a flat face that is substantially on the same plane as a top face of the flat portion; and
a translucent member sealing part of the metal member and the light emitting element, the translucent member having a convex portion and a flange disposed around the convex portion, the flange being disposed outside the illumination range of light emitted from the light emitting element.

2. The light emitting device according to claim 1, wherein the covering member is formed from polyphthalamide.

3. The light emitting device according to claim 1, wherein the covering member contains carbon black.

4. The light emitting device according to claim 1, wherein the covering member has protrusions on the side faces of the covering member.

5. The light emitting device according to claim 1, wherein the translucent member is softer than the covering member.

6. The light emitting device according to claim 5, wherein part of the flat portion of the metal member is disposed within the flange.

7. The light emitting device according to claim 1, wherein the thickness of the translucent member at the flange is 50 to 100 μm.

8. The light emitting device according to claim 1, wherein the element placement portion of the metal member has a concave portion by being bent to the bottom face side of the light emitting device with respect to the flat portion.

9. A light emitting device, comprising:
a light emitting element;
a metal member having a first face and a second face on an opposite side from the first face, the first face having an element placement portion on which the light emitting element is mounted and a flat portion disposed around the element placement portion;
a covering member disposed on the second face of the metal member at the flat portion outside an illumination range of light emitted from the light emitting element, a top face of a portion of the covering member adjacent to the metal member being a flat face that is substantially on the same plane as a top face of the flat portion; and
a translucent member that seals part of the metal member and the light emitting element, the translucent member being softer than the covering member.

10. The light emitting device according to claim 9, wherein the covering member is formed from polyphthalamide.

11. The light emitting device according to claim 9, wherein the covering member contains carbon black.

12. The light emitting device according to claim 9, wherein the covering member has protrusions on the side faces of the covering member.

13. The light emitting device according to claim 9, wherein part of the flat portion of the metal member is disposed within the flange.

14. The light emitting device according to claim 9, wherein the thickness of the translucent member at the flange is 50 to 100 μm.

15. The light emitting device according to claim 9, wherein the element placement portion of the metal member has a concave portion by being bent to the bottom face side of the light emitting device with respect to the flat portion.

* * * * *